US012347494B2

(12) United States Patent
Wang et al.

(10) Patent No.: US 12,347,494 B2
(45) Date of Patent: Jul. 1, 2025

(54) ON-CHIP PERFORMANCE THROTTLING

(71) Applicant: Western Digital Technologies, Inc., San Jose, CA (US)

(72) Inventors: Panni Wang, San Jose, CA (US); Xiaojia Jia, San Jose, CA (US); Zhixin Cui, San Jose, CA (US); Swaroop Kaza, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 169 days.

(21) Appl. No.: 18/225,253

(22) Filed: Jul. 24, 2023

(65) Prior Publication Data

US 2024/0282379 A1 Aug. 22, 2024

Related U.S. Application Data

(60) Provisional application No. 63/446,117, filed on Feb. 16, 2023.

(51) Int. Cl.
*G11C 16/04* (2006.01)
*G11C 16/08* (2006.01)
*G11C 16/10* (2006.01)

(52) U.S. Cl.
CPC .......... *G11C 16/10* (2013.01); *G11C 16/0483* (2013.01); *G11C 16/08* (2013.01)

(58) Field of Classification Search
CPC ................ G11C 16/0483; G11C 16/3454
See application file for complete search history.

(56) References Cited

U.S. PATENT DOCUMENTS 10,381,095 B1 * 8/2019 Date ...................... G11C 16/16

* cited by examiner

Primary Examiner — Jason Lappas
(74) Attorney, Agent, or Firm — Dickinson Wright PLLC

(57) ABSTRACT

A memory device includes a memory block with memory cells that are arranged in word lines. Control circuitry in the memory device selects a word line to program; sets a programming pulse voltage to a starting value; and determines an operating temperature and compares the operating temperature to a first threshold temperature. In response to the operating temperature being less than the first threshold temperature, the control circuitry sets a program voltage step size to a baseline. In response to the operating temperature being greater than a first threshold temperature, the control circuitry sets the program voltage step size to a high temperature step size that is less than the baseline step size. The control circuitry programs the selected word line. Each program loop includes a programming pulse, and the control circuitry increases a magnitude of the programming pulse between program loops by the program voltage step size.

20 Claims, 18 Drawing Sheets

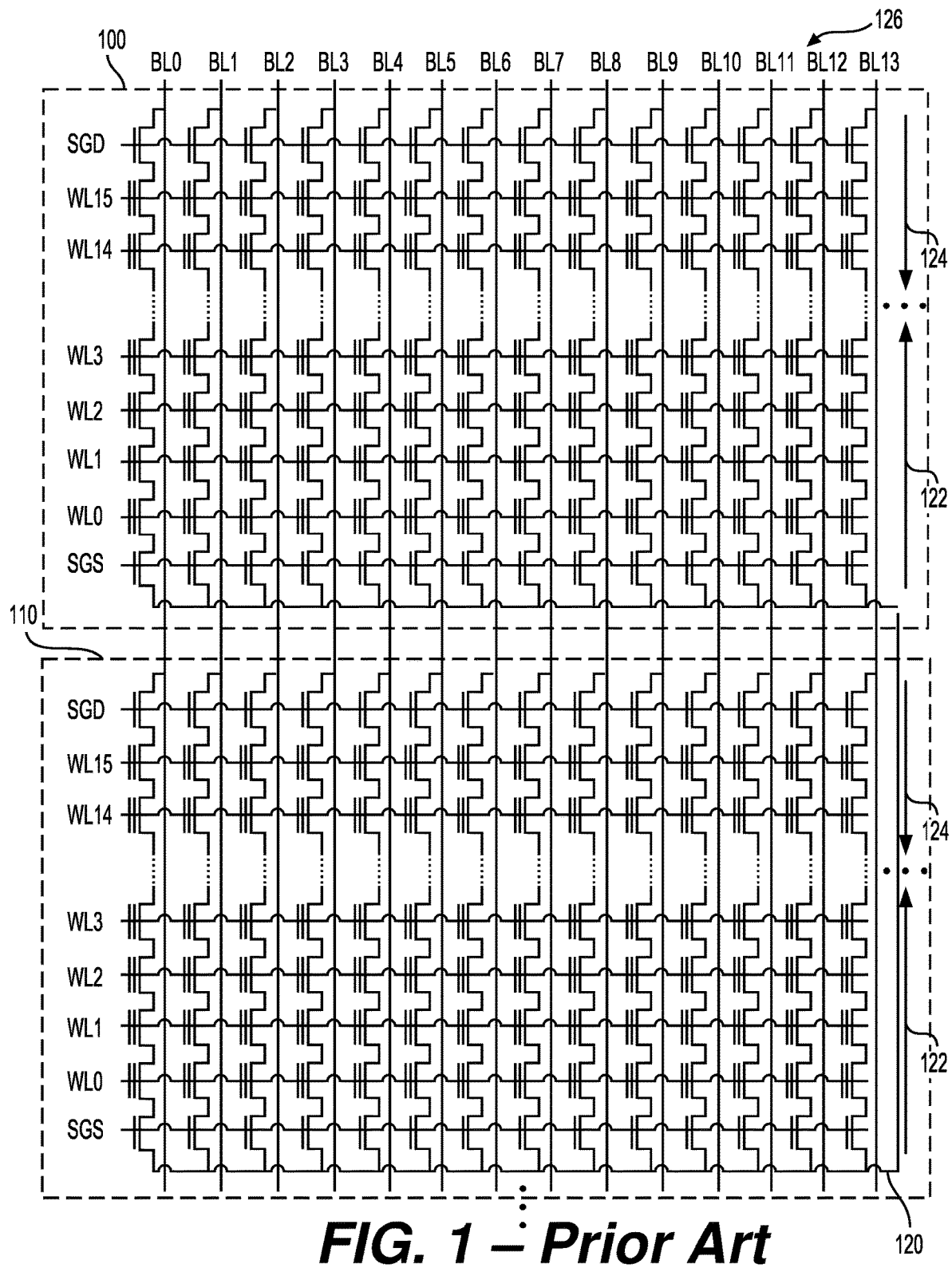
*FIG. 1 – Prior Art*

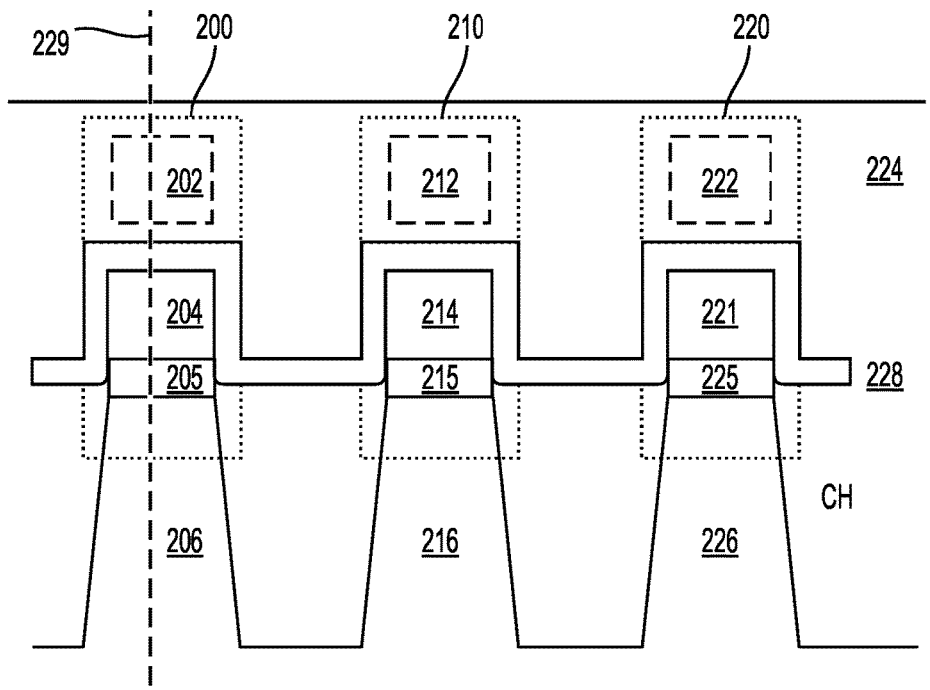
*FIG. 2A - Prior Art*
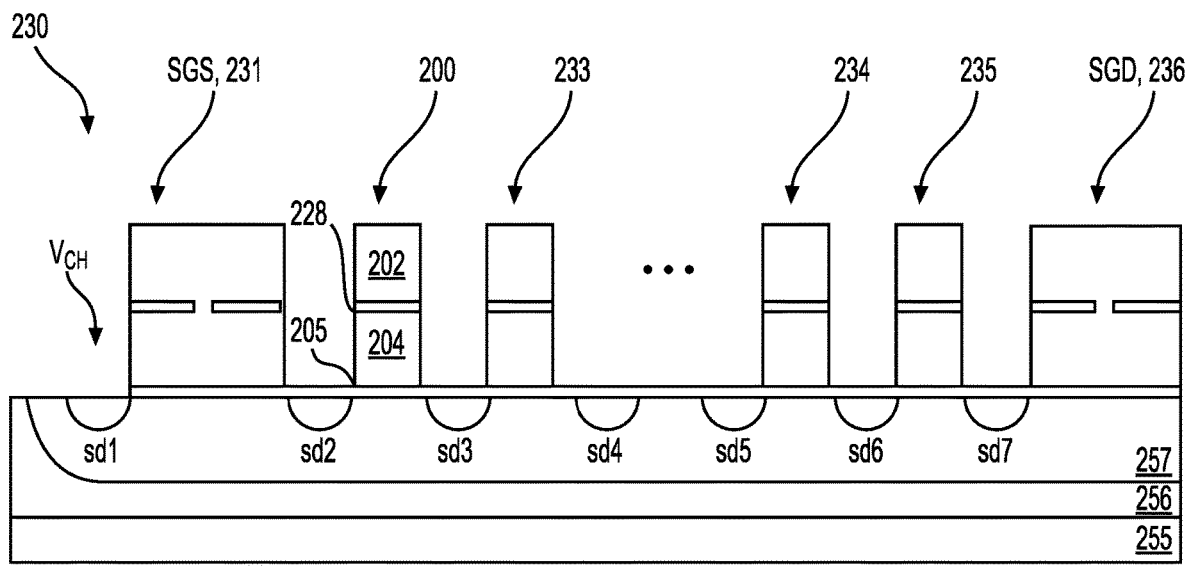
*FIG. 2B – Prior Art*

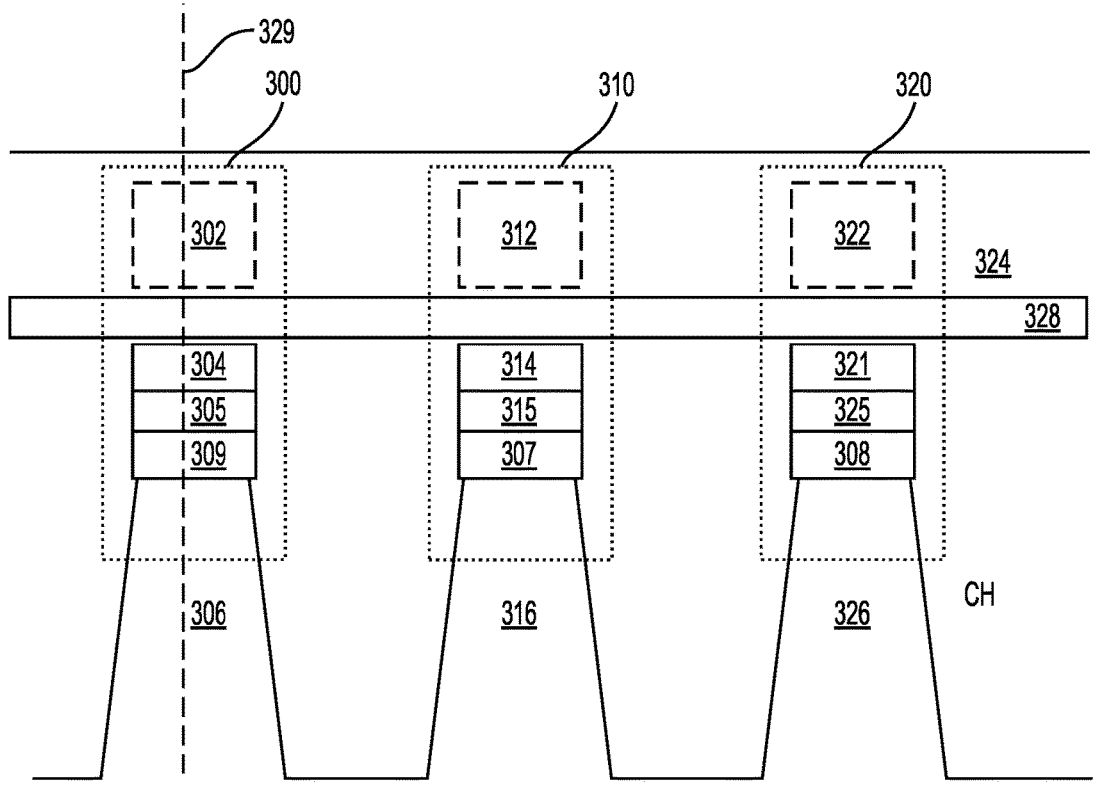
FIG. 3A – Prior Art
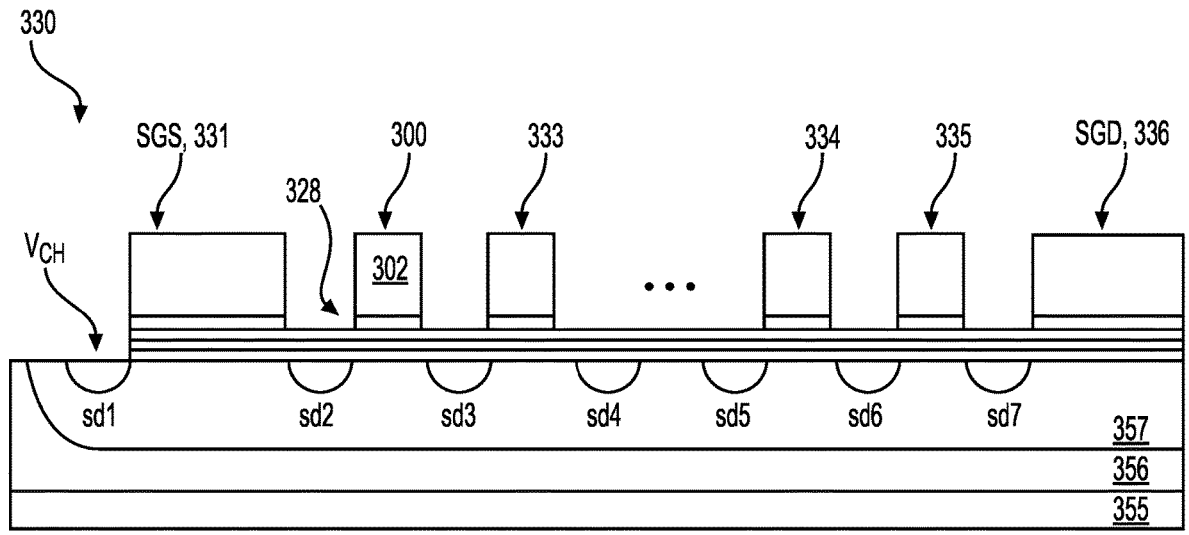
FIG. 3B – Prior Art

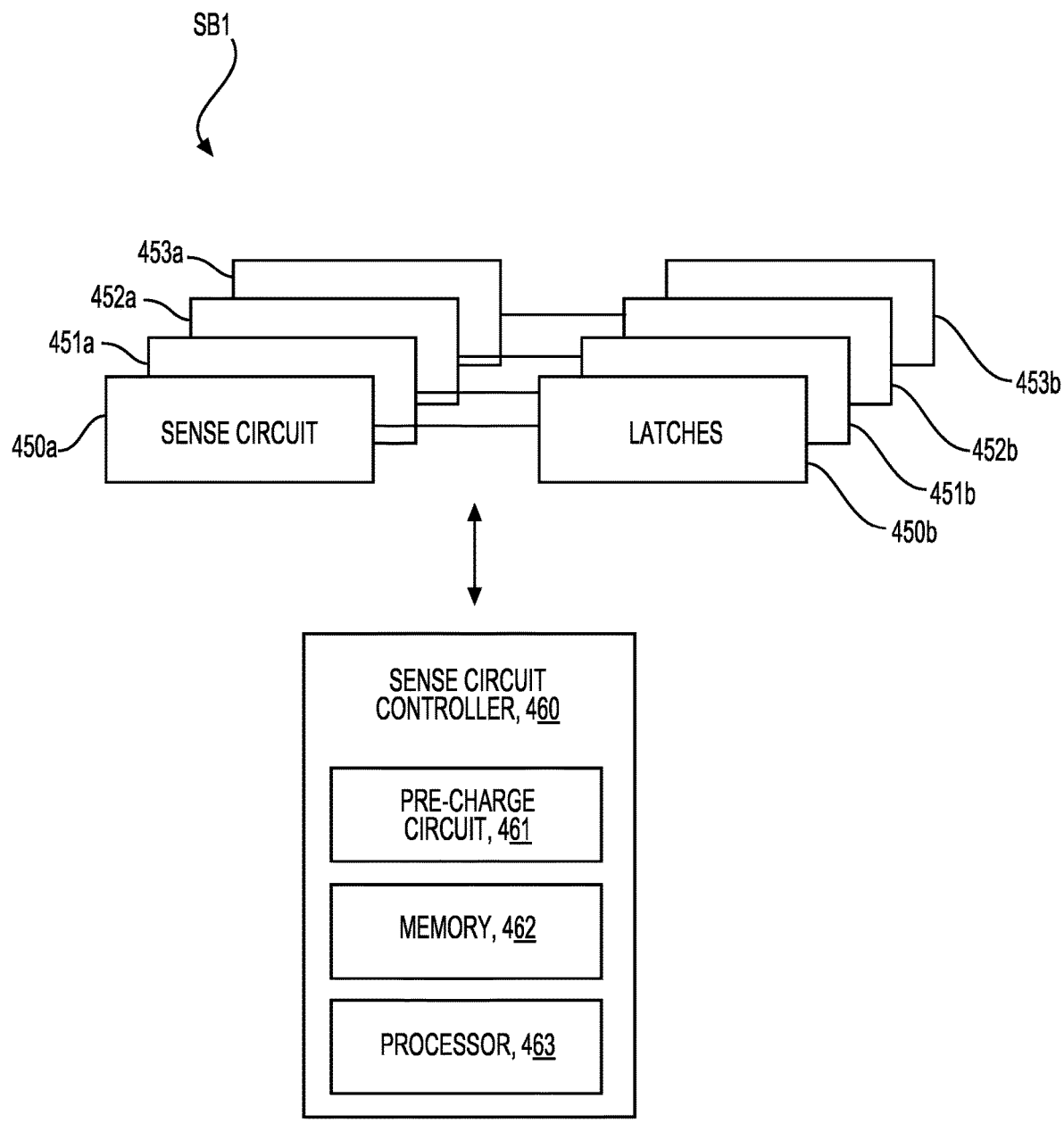
FIG. 4 – Prior Art

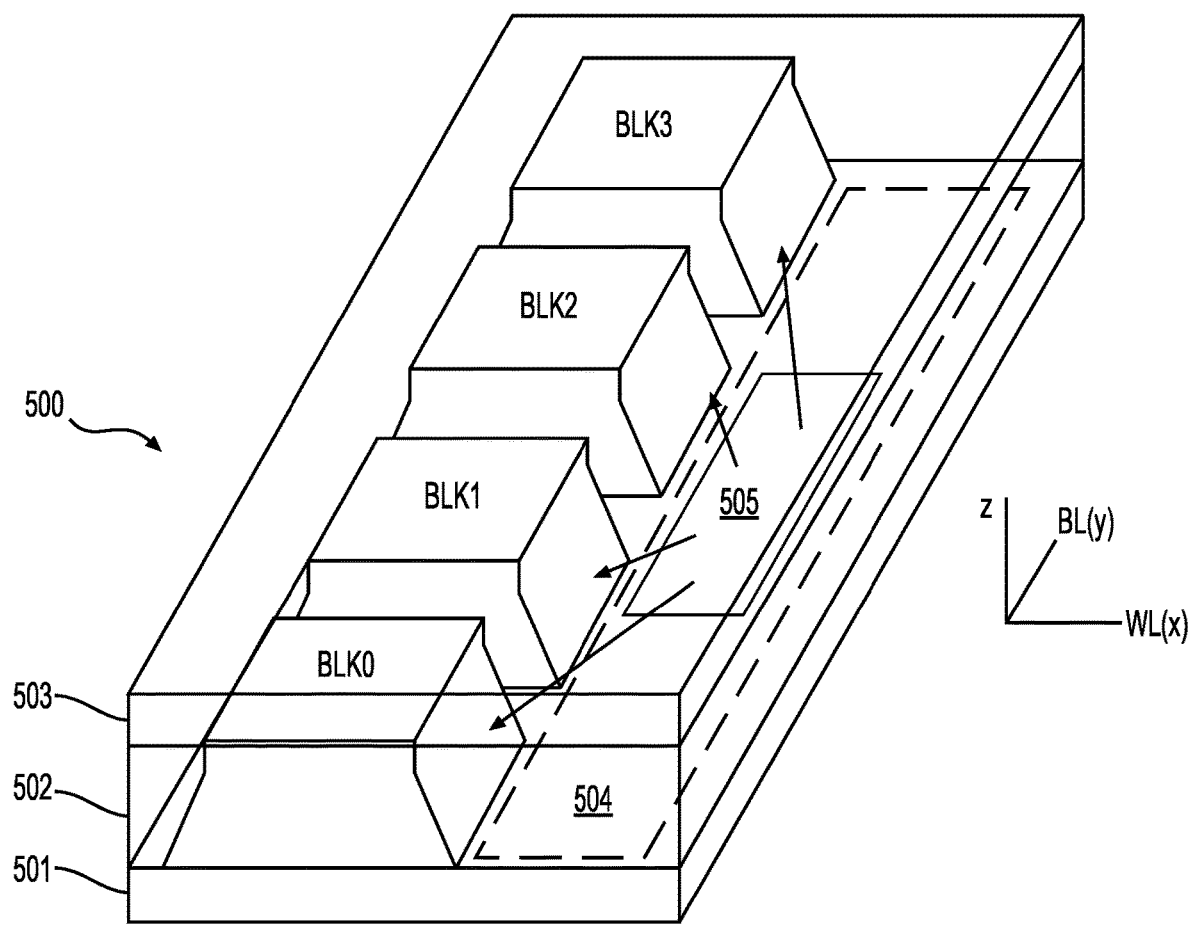
FIG. 5A – Prior Art

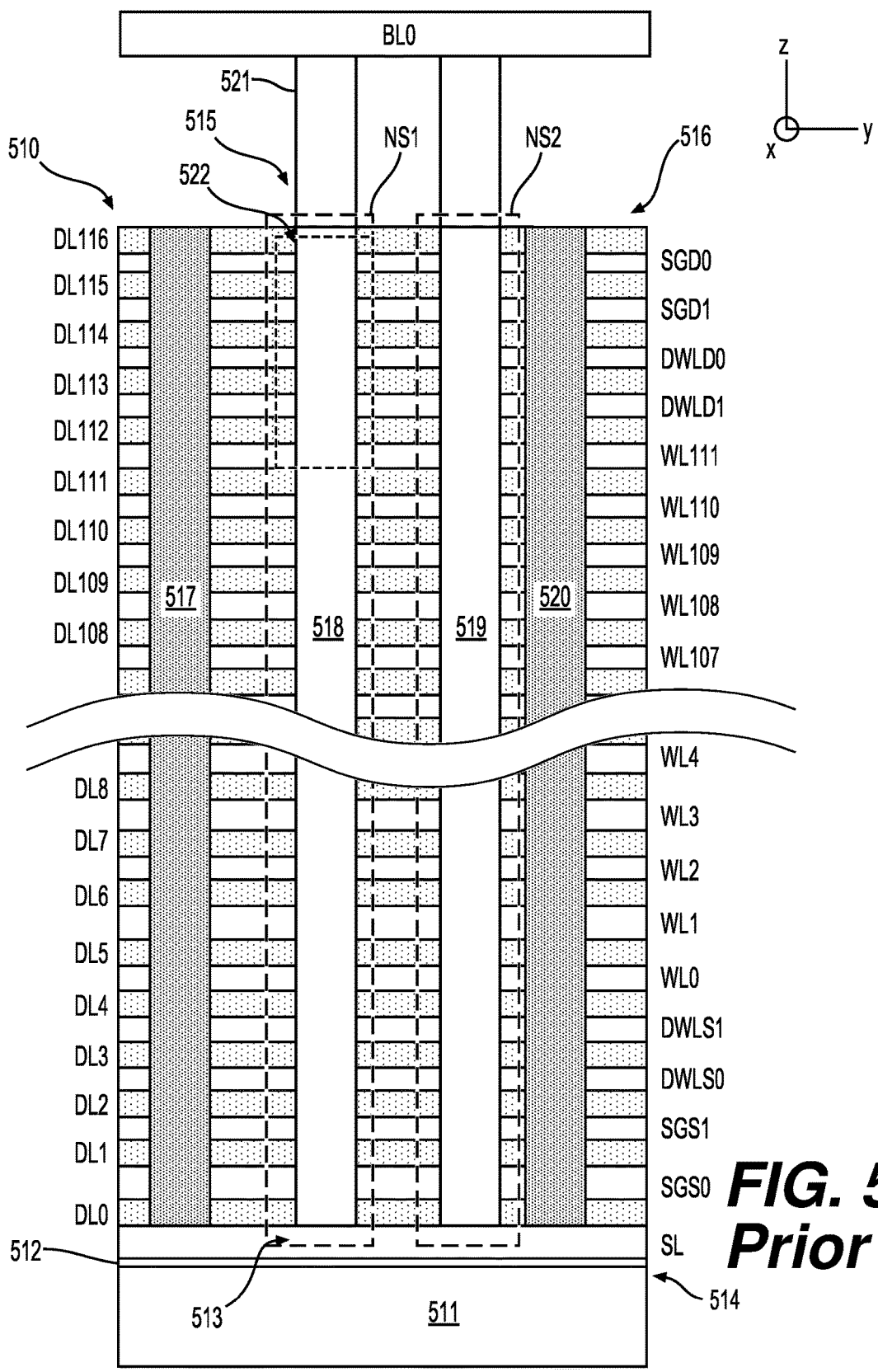
FIG. 5B - Prior Art

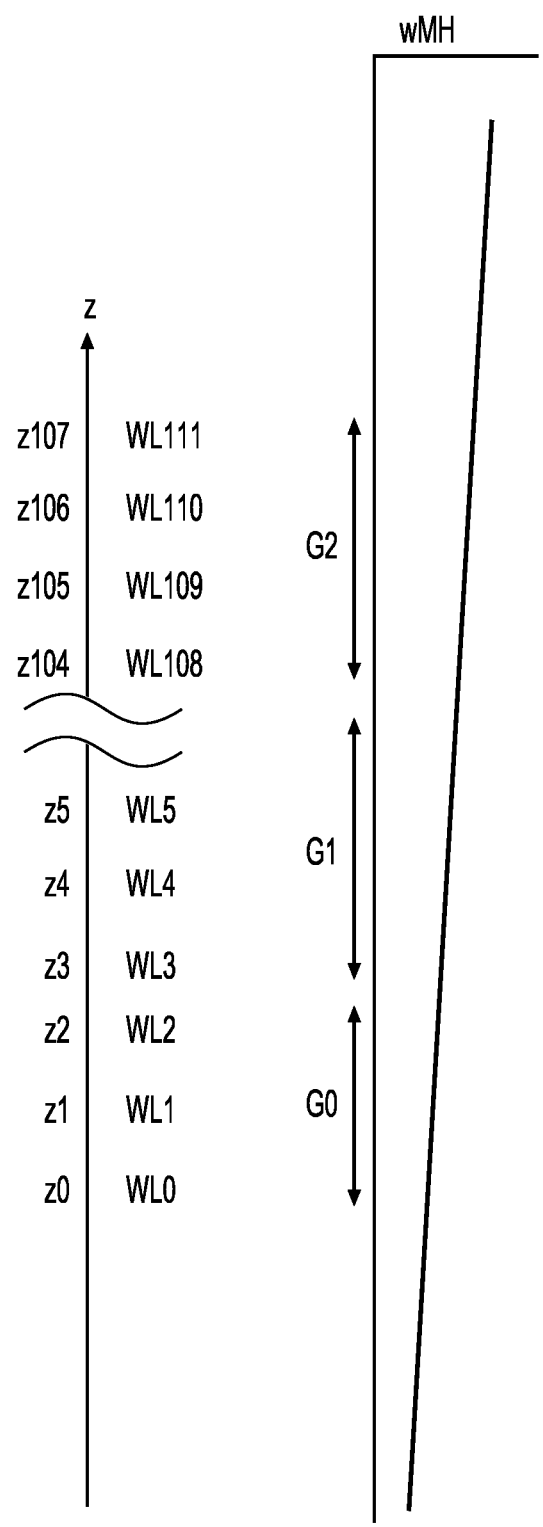
FIG. 5C – Prior Art

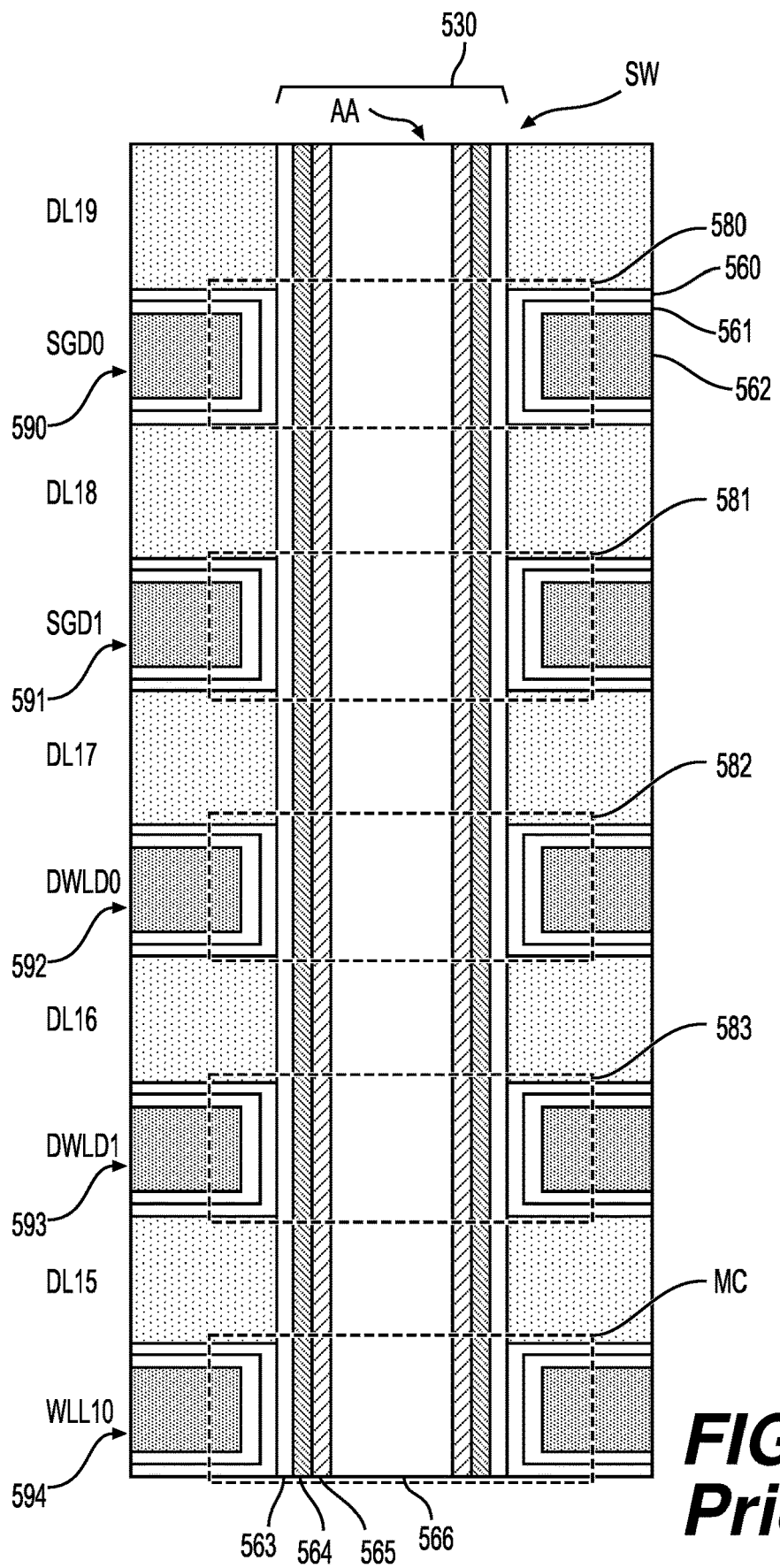
FIG. 5D – Prior Art

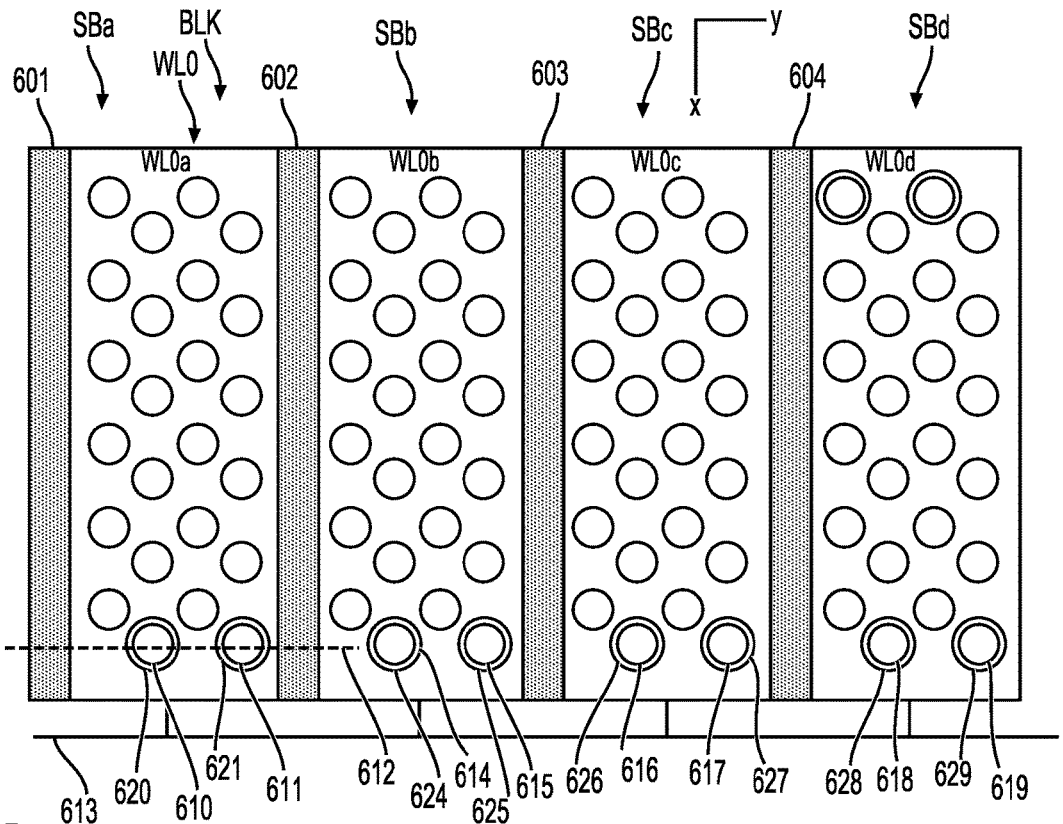
FIG. 6A – Prior Art
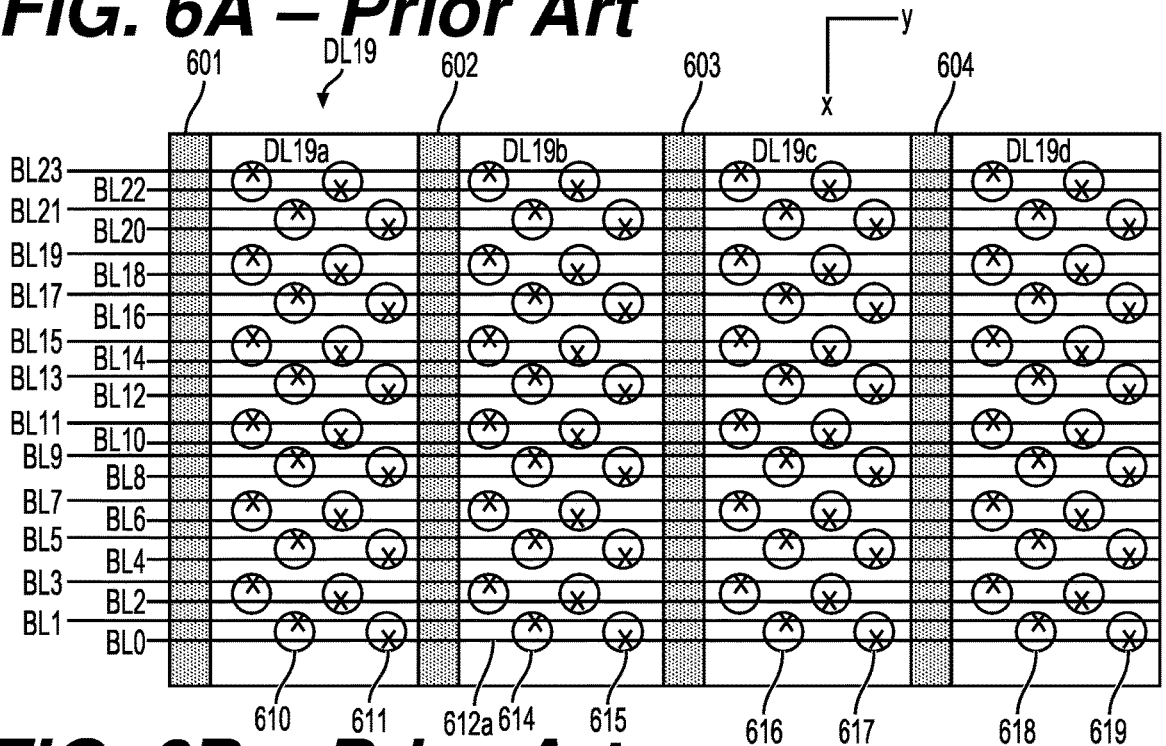
FIG. 6B – Prior Art

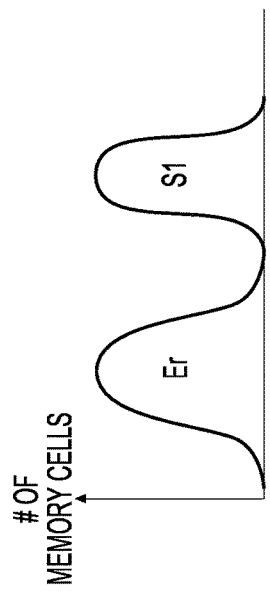
FIG. 7 – Prior Art
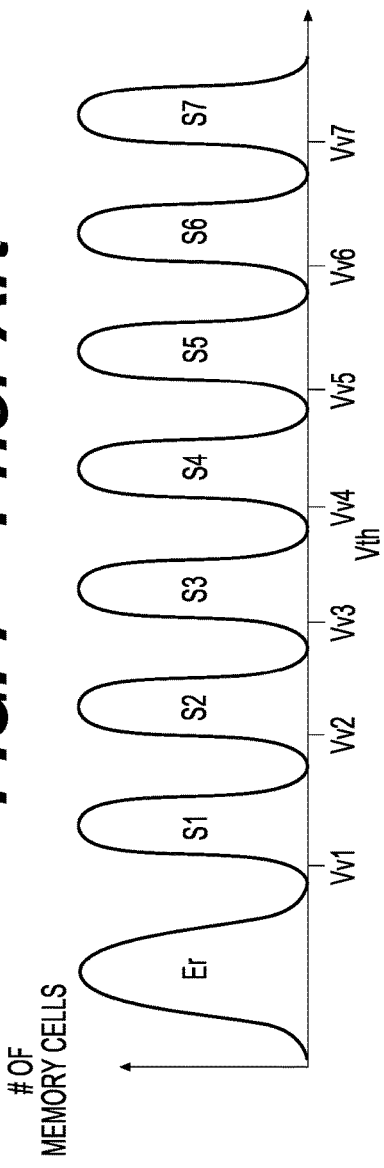
FIG. 8 – Prior Art
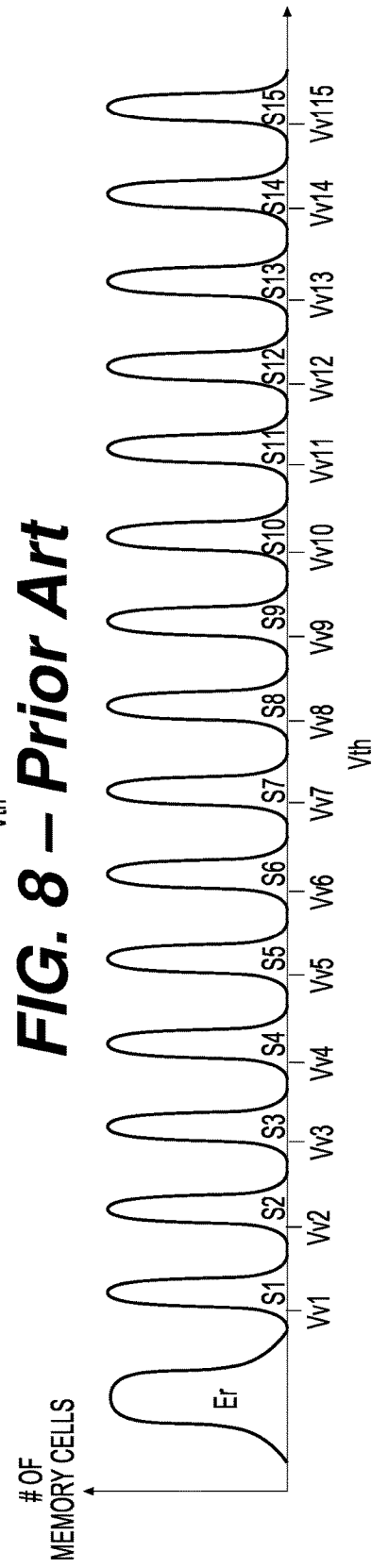
FIG. 9 – Prior Art

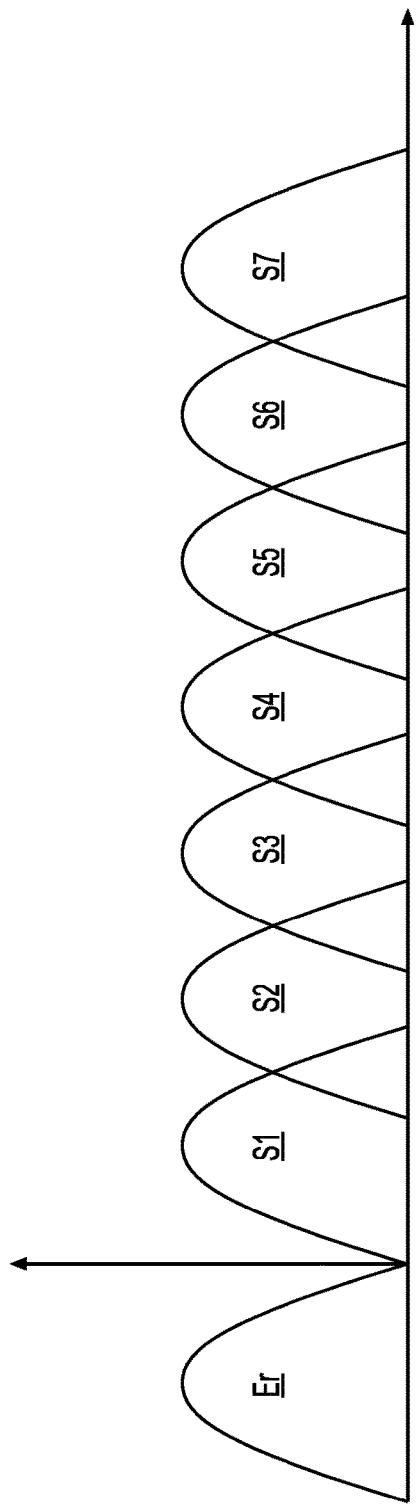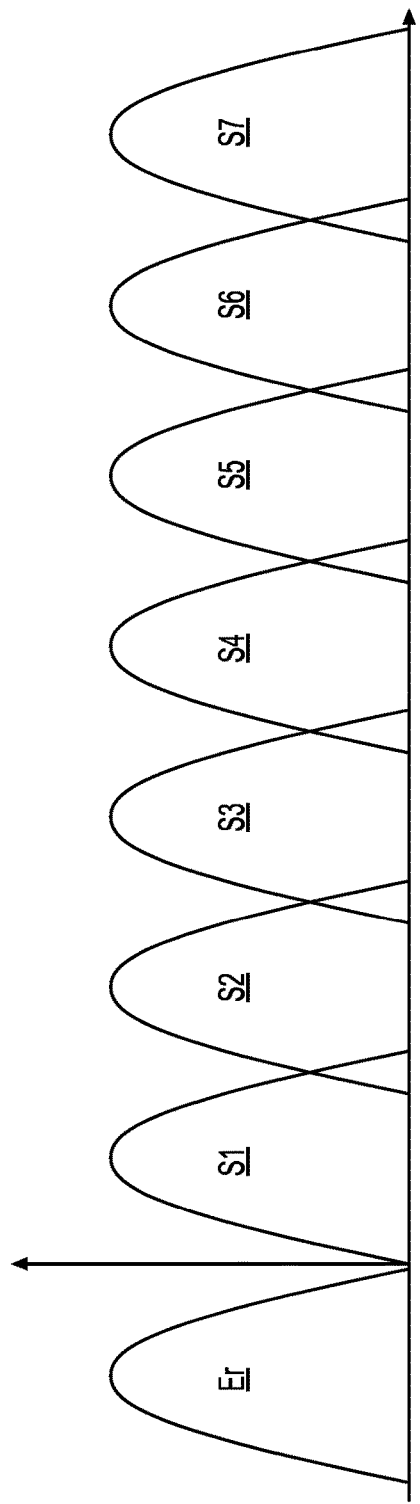
FIG. 14A
FIG. 14B

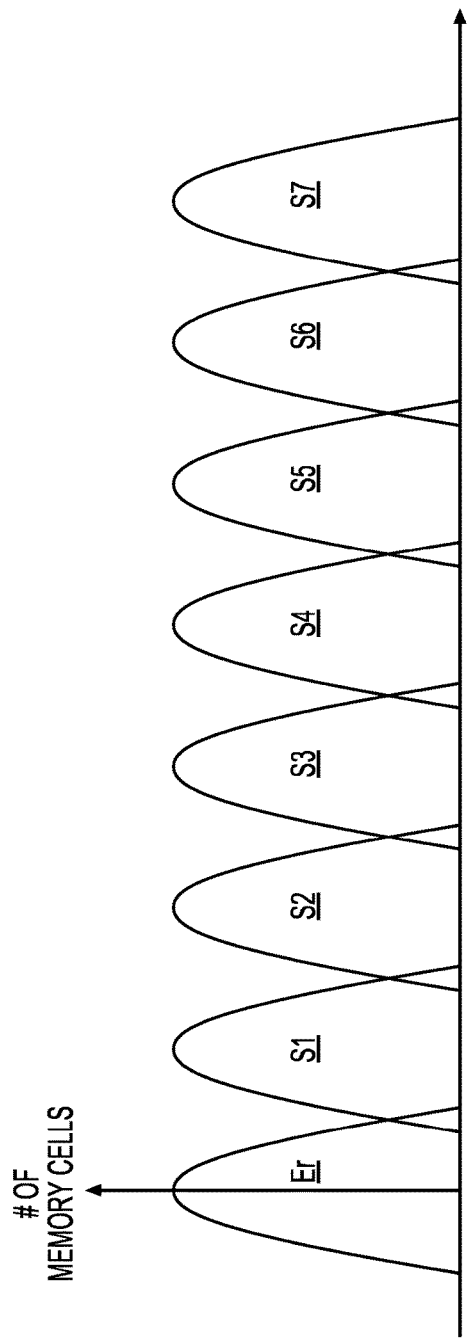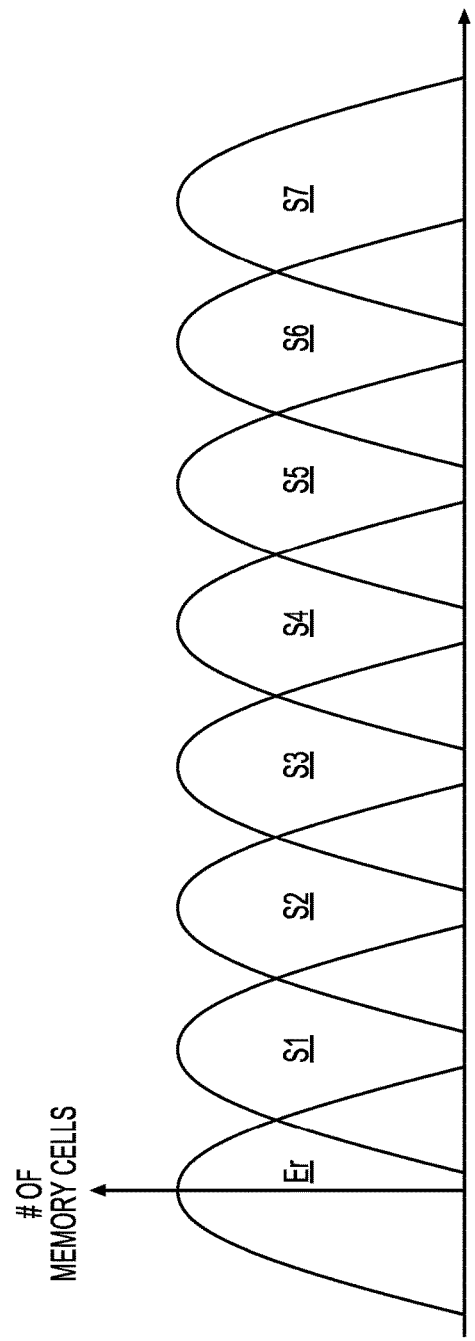

ON-CHIP PERFORMANCE THROTTLING

CROSS-REFERENCE TO RELATED APPLICATIONS

This application claims the benefit of U.S. Provisional Application No. 63/446,117, filed on Feb. 16, 2023. The entire disclosure of the application referenced above is incorporated herein by reference.

BACKGROUND

1. Field

The present disclosure is related to programming techniques for improving chip performance over an increased temperature range.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND is one type of non-volatile memory, and a NAND memory device typically includes a chip with a plurality of memory blocks, each of which includes an array of memory cells arranged in a plurality of word lines. A pair of example memory blocks 100, 110 are illustrated in a FIG. 1. In this example, the memory blocks 100, 110 have a two-dimensional configuration. A memory array in the chip can include many such blocks 100, 110. Each example block 100, 110 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 120. One hundred and twelve word lines (WL0-WL111), for example, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 2A and 2B. However, other types of non-volatile memory can also be used. As discussed in further detail below, in another example shown in FIGS. 3A and 3B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the cell channel into the nitride, where they are trapped and stored in a limited region. This stored charge then changes the threshold voltage Vt of a portion of the channel of the cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known.

FIG. 2A illustrates a cross-sectional view of example floating gate memory cells 200, 210, 220 in NAND strings. In this Figure, a bit line or NAND string direction goes into the page, and a word line direction goes from left to right. As an example, word line 224 extends across NAND strings which include respective channel regions 206, 216 and 226. The memory cell 200 includes a control gate 202, a floating gate 204, a tunnel oxide layer 205 and the channel region 206. The memory cell 210 includes a control gate 212, a floating gate 214, a tunnel oxide layer 215 and the channel region 216. The memory cell 220 includes a control gate 222, a floating gate 221, a tunnel oxide layer 225 and the channel region 226. Each memory cell 200, 210, 220 is in a different respective NAND string. An inter-poly dielectric (IPD) layer 228 is also illustrated. The control gates 202, 212, 222 are portions of the word line. A cross-sectional view along contact line connector 229 is provided in FIG. 2B.

The control gate 202, 212, 222 wraps around the floating gate 204, 214, 221, increasing the surface contact area between the control gate 202, 212, 222 and floating gate 204, 214, 221. This results in higher IPD capacitance, leading to a higher coupling ratio which makes programming and erase easier. However, as NAND memory devices are scaled down, the spacing between neighboring cells 200, 210, 220 becomes smaller so there is almost no space for the control gate 202, 212, 222 and the IPD layer 228 between two adjacent floating gates 202, 212, 222.

As an alternative, as shown in FIGS. 3A and 3B, the flat or planar memory cell 300, 310, 320 has been developed in which the control gate 302, 312, 322 is flat or planar; that is, it does not wrap around the floating gate and its only contact with the IPD layer 328 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3A depicts a cross-sectional view of example charge-trapping memory cells 300, 310, 320 in NAND strings. The view is in a word line direction of memory cells 300, 310, 320 comprising a flat control gate and charge-trapping regions as a two-dimensional example of memory cells 300, 310, 320 in the memory cell array 126. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 324 extends across NAND strings which include respective channel regions 306, 316, 326. Portions of the word line provide control gates 302, 312, 322. Below the word line is an IPD layer 328, charge-trapping layers 304, 314, 321, polysilicon layers 305, 315, 325, and tunneling layers 309, 307, 308. Each charge-trapping layer 304, 314, 321 extends continuously in a respective NAND string. The flat configuration of the control gate can be made thinner than a floating gate. Additionally, the memory cells can be placed closer together.

FIG. 3B illustrates a cross-sectional view of the structure of FIG. 3A along contact line connector 329. The NAND string 330 includes an SGS transistor 331, example memory cells 300, 333, . . . 335, and an SGD transistor 336. Passageways in the IPD layer 328 in the SGS and SGD transistors 331, 336 allow the control gate layers 302 and floating gate layers to communicate. The control gate 302 and floating gate layers may be polysilicon and the tunnel oxide layer may be silicon oxide, for instance. The IPD layer 328 can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4 illustrates an example block diagram of a sense block SB1 in a memory chip. In one approach, a sense block comprises multiple sense circuits. Each sense circuit is associated with data latches. For example, the example sense circuits 450a, 451a, 452a, and 453a are associated with the data latches 450b, 451b, 452b, and 453b, respectively. In one approach, different subsets of bit lines can be sensed using different respective sense blocks. This allows the processing load which is associated with the sense circuits to be divided up and handled by a respective processor in each sense block. For example, a sense circuit controller 460 in SB1 can communicate with the set of sense circuits and latches. The sense circuit controller 460 may include a pre-charge circuit 461 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 460 may also include a pre-charge circuit 461, a memory 462 and a processor 463. The memory 462 may store code which is executable by the processor to perform the functions described herein. These functions can include reading the latches 450b, 451b, 452b, 453b which are associated with the sense circuits 450a, 451a, 452a, 453a, setting bit values in the latches and providing voltages for setting pre-charge levels in sense nodes of the sense circuits 450a, 451a, 452a, 453a. Further example details of the sense circuit controller 460 and the sense circuits 450a, 451a, 452a, 453a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 5A is a perspective view of a set of blocks 500 in an example three-dimensional configuration. On the substrate are example blocks BLK0, BLK1, BLK2, BLK3 of memory cells (storage elements) and a peripheral area 504 with circuitry for use by the blocks BLK0, BLK1, BLK2, BLK3. For example, the circuitry can include voltage drivers 505 which can be connected to control gate layers of the blocks BLK0, BLK1, BLK2, BLK3. In one approach, control gate layers at a common height in the blocks BLK0, BLK1, BLK2, BLK3 are commonly driven. The substrate 501 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 502 of the memory device. In an upper region 503 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 5B illustrates an example cross-sectional view of a portion of one of the blocks BLK0, BLK1, BLK2, BLK3 of FIG. 5A. The block comprises a stack 510 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 510 which comprise NAND strings NS1 and NS2 are illustrated. Each NAND string encompasses a memory hole 518, 519 which is filled with materials which form memory cells adjacent to the word lines. A region 522 of the stack 510 is shown in greater detail in FIG. 5D and is discussed in further detail below.

The stack 510 includes a substrate 511, an insulating film 512 on the substrate 511, and a portion of a source line SL. NS1 has a source-end 513 at a bottom 514 of the stack and a drain-end 515 at a top 516 of the stack 510. Contact line connectors (e.g., slits, such as metal-filled slits) 517, 520 may be provided periodically across the stack 510 as interconnects which extend through the stack 510, such as to connect the source line to a particular contact line above the stack 510. The contact line connectors 517, 520 may be used during the formation of the word lines and subsequently filled with metal. A portion of a bit line BL0 is also illustrated. A conductive via 521 connects the drain-end 515 to BL0.

FIG. 5C illustrates a plot of memory hole diameter in the stack of FIG. 5B. The vertical axis is aligned with the stack of FIG. 5B and illustrates a width (wMH), e.g., diameter, of the memory holes 518 and 519. The word line layers WL0-WL111 of FIG. 5A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

FIG. 5D illustrates a close-up view of the region 522 of the stack 510 of FIG. 5B. Memory cells are formed at the different levels of the stack at the intersection of a word line layer and a memory hole. In this example, SGD transistors 580, 581 are provided above dummy memory cells 582, 583 and a data memory cell MC. A number of layers can be deposited along the sidewall (SW) of the memory hole 530 and/or within each word line layer, e.g., using atomic layer deposition. For example, each column (e.g., the pillar which is formed by the materials within a memory hole 530) can include a charge-trapping layer or film 563 such as SiN or other nitride, a tunneling layer 564, a polysilicon body or channel 565, and a dielectric core 566. A word line layer can include a blocking oxide/block high-k material 560, a metal barrier 561, and a conductive metal 562 such as Tungsten as a control gate. For example, control gates 590, 591, 592, 593, and 594 are provided. In this example, all of the layers except the metal are provided in the memory hole 530. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the electrons return to the channel.

Each of the memory holes 530 can be filled with a plurality of annular layers comprising a blocking oxide layer, a charge trapping layer 563, a tunneling layer 564 and a channel layer. A core region of each of the memory holes 530 is filled with a body material, and the plurality of annular layers are between the core region and the word line in each of the memory holes 530.

The NAND string can be considered to have a floating body channel because the length of the channel is not formed on a substrate. Further, the NAND string is provided by a plurality of word line layers above one another in a stack, and separated from one another by dielectric layers.

FIG. 6A illustrates a top view of an example word line layer WL0 of the stack 510 of FIG. 5B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 613. The last region of a word line layer in a block can be connected to a first region of a word line layer in a next block, in one approach. The contact line 613, in turn, is connected to a voltage driver for the word line layer. The region WL0a has example memory holes 610, 611 along a contact line 612. The region WL0b has example memory holes 614, 615. The region WL0c has example memory holes 616, 617. The region WL0d has example memory holes 618, 619. The memory holes are also shown in FIG. 6B. Each memory hole can be part of a respective NAND string. For example, the memory holes 610, 614, 616 and 618 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 620, 621 are in WL0a, memory cells 624, 625 are in WL0b, memory cells 626, 627 are in WL0c, and memory cells 628, 629 are in WL0d. These memory cells are at a common height in the stack.

Contact line connectors (e.g., slits, such as metal-filled slits) 601, 602, 603, 604 may be located between and adjacent to the edges of the regions WL0a-WL0d. The contact line connectors 601, 602, 603, 604 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 6B illustrates a top view of an example top dielectric layer DL116 of the stack of FIG. 5B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 610, 611 along a contact line 612, which is coincident with a bit line BL0. A number of bit lines extend above the memory holes and are connected to the memory holes as indicated by the "X" symbols. BL0 is connected to a set of memory holes which includes the memory holes 611, 615, 617, 619. Another example bit line BL1 is connected to a set of memory holes which includes the memory holes 610, 614, 616, 618. The contact line connectors (e.g., slits, such as metal-filled slits) 601, 602, 603, 604 from FIG. 6A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to retain one or more bits of data in multiple data states, each of which is associated with a respective threshold voltage Vt range. For example, FIG. 7 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 8 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 9 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states.

One measure of the operation of a memory device is the threshold voltage Vt margin, which is a measurement of the voltage gap between the distributions of data states, such as those of FIGS. 7-9. An increase in the Vt margin is associated with improved reliability because of greater Vt margin makes it easier for the memory device to identify which data state a memory cell is in during a later read operation. In some cases, Vt margin may fall when memory cells are programmed at very high or extreme temperatures, e.g., above sixty degrees Celsius (60° C.). One approach to improve Vt margin when operating at such extreme temperatures is to reduce the performance of all aspects of the memory chip (controller operations, programming, sensing, etc.), i.e., throttle the chip. Throttling the memory chip reduces heat generation, to allow the chip to cool down.

SUMMARY

One aspect of the present disclosure is related to a method of programming a memory device. The method includes the step of preparing a memory block that includes a plurality of memory cells that are arranged in a plurality of word lines. The method proceeds with the step of selecting a word line to program. The method continues with the step of setting a programming pulse voltage to a starting programming pulse value. The method proceeds with the steps of determining an operating temperature of the memory device and comparing the operating temperature to a first threshold temperature. In response to the operating temperature of the memory device being less than the threshold temperature, the method continues with the step of setting a program voltage step size to a baseline step size. In response to the operating temperature of the memory device being greater than a first threshold temperature, the method proceeds with the step of setting the program voltage step size to a high temperature step size that is less than the baseline step size. The method continues with the step of programming the memory cells of the selected word line in a plurality of program loops. Each program loop includes a programming pulse, and a magnitude of the programming pulse increases between program loops by the program voltage step size.

According to another aspect of the present disclosure, the method further includes the step of comparing the operating temperature to a second threshold temperature that is greater than the first threshold temperature. In response to the operating temperature being greater than the second threshold temperature, the method proceeds with throttling the memory device.

According to yet another aspect of the present disclosure, the first threshold temperature is a first high temperature threshold and the second threshold temperature is a second high temperature threshold. The method further includes the step of comparing the operating temperature to a low temperature threshold that is less than the first high temperature threshold. In response to the operating temperature being below the low temperature threshold, the method proceeds with the step of setting the program voltage step size to a low temperature step size that is less than the baseline step size.

According to still another aspect of the present disclosure, the low temperature step size is in the range of 0.05 V to 0.8 V less than the baseline step size.

According to a further aspect of the present disclosure, the high temperature step size is in the range of 0.05 V to 0.8 V less than the baseline step size.

According to yet a further aspect of the present disclosure, the method further includes the steps of selecting a next word line to program; setting the programming pulse voltage to the starting programming pulse voltage; and programming the memory cells of the selected word line in a plurality of program loops. Each program loop includes a programming pulse, and a magnitude of the programming pulse increases between program loops by the program voltage step size.

According to still a further aspect of the present disclosure, the step of programming the memory cells of the selected word line includes programming the memory cells of the selected word line to at least three bits of data per memory cell.

Another aspect of the present disclosure is related to a memory device. The memory device includes a memory block with a plurality of memory cells that are arranged in a plurality of word lines. The memory device further includes control circuitry that is configured to program the plurality of memory cells of the plurality of word lines. The control circuitry is configured to select a word line to program; set a programming pulse voltage to a starting programming pulse value; and determine an operating temperature of the memory device and compare the operating temperature to a first threshold temperature. In response to the operating temperature of the memory device being less than the threshold temperature, the control circuitry is configured to set a program voltage step size to a baseline step size. In response to the operating temperature of the memory device being greater than a first threshold temperature, the control circuitry is configured to set the program voltage step size to a high temperature step size that is less than the baseline step size. The control circuitry is further configured to program the memory cells of the selected word line in a plurality of program loops. Each program loop includes a programming pulse, and the control circuitry increases a magnitude of the programming pulse between program loops by the program voltage step size.

According to another aspect of the present disclosure, the control circuitry is further configured to compare the operating temperature to a second threshold temperature that is greater than the first threshold temperature. In response to the operating temperature being greater than the second threshold temperature, the control circuitry is further configured to throttle the memory device.

According to yet another aspect of the present disclosure, the first threshold temperature is a first high temperature threshold and the second threshold temperature is a second high temperature threshold. The control circuitry is further configured to compare the operating temperature to a low temperature threshold that is less than the first high temperature threshold. In response to the operating temperature being below the low temperature threshold, the control circuitry is configured to set the program voltage step size to a low temperature step size that is less than the baseline step size.

According to still another aspect of the present disclosure, the low temperature step size is in the range of 0.05 V to 0.8 V less than the baseline step size.

According to a further aspect of the present disclosure, the high temperature step size is in the range of 0.05 V to 0.8 V less than the baseline step size.

According to yet a further aspect of the present disclosure, the control circuitry is further configured to select a next word line to program; set the programming pulse voltage to the starting programming pulse voltage; and program the memory cells of the selected word line in a plurality of program loops. Each program loop includes a programming pulse. A magnitude of the programming pulse increases between program loops by the program voltage step size.

According to still a further aspect of the present disclosure, the control circuitry is further configured to program the memory cells of the selected word line to at least three bits of data per memory cell.

Yet another aspect of the present disclosure is related to an apparatus. The apparatus includes a memory block with a plurality of memory cells that are arranged in a plurality of word lines. The apparatus also includes a programming means for programming the plurality of memory cells of the plurality of word lines. The programming means is configured to select a word line to program and determine an operating temperature of the memory device and compare the operating temperature to a first threshold temperature. In response to the operating temperature of the memory device being less than the threshold temperature, the programming means is configured to set a program voltage step size to a baseline step size. In response to the operating temperature of the memory device being greater than a first threshold temperature, the programming means is configured to set the program voltage step size to a high temperature step size that equal to the baseline step size minus a high temperature bias. The programming means is further configured to program the memory cells of the selected word line in a plurality of program loops. Each program loop including a programming pulse, and the control circuitry increases a magnitude of the programming pulse between program loops by the program voltage step size.

According to another aspect of the present disclosure, the programming means is further configured to compare the operating temperature to a second threshold temperature that is greater than the first threshold temperature. In response to the operating temperature being greater than the second threshold temperature, the programming means is configured to throttle the memory device.

According to yet another aspect of the present disclosure, the first threshold temperature is a first high temperature threshold and the second threshold temperature is a second high temperature threshold. The programming means is further configured to compare the operating temperature to a low temperature threshold that is less than the first high temperature threshold. In response to the operating temperature being below the low temperature threshold, the programming means is configured to set the program voltage step size to a low temperature step size that is less than the baseline step size.

According to still another aspect of the present disclosure, the low temperature step size is in the range of 0.05 V to 0.8 V less than the baseline step size.

According to a further aspect of the present disclosure, the high temperature step size is in the range of 0.05 V to 0.8 V less than the baseline step size.

According to yet a further aspect of the present disclosure, the programming means is further configured to select a next word line to program; set the programming pulse voltage to the starting programming pulse voltage; and program the memory cells of the selected word line in a plurality of program loops. Each program loop includes a programming pulse. A magnitude of the programming pulse increasing between program loops by the program voltage step size.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 1 depicts blocks of memory cells in an example two-dimensional configuration of a memory array;

FIG. 2A and FIG. 2B depict cross-sectional views of example floating gate memory cells in NAND strings;

FIG. 3A and FIG. 3B depict cross-sectional views of example charge-trapping memory cells in NAND strings;

FIG. 4 depicts an example block diagram of a sense block SB1;

FIG. 5A is a perspective view of a set of blocks in an example three-dimensional configuration of a memory array;

FIG. 5B depicts an example cross-sectional view of a portion of one of the blocks of FIG. 5A;

FIG. 5C depicts a plot of memory hole diameter of the stack of FIG. 5B;

FIG. 5D depicts a close-up view of region 522 of the stack of FIG. 5B;

FIG. 6A depicts a top view of an example word line layer WL0 of the stack of FIG. 5B;

FIG. 6B depicts atop view of an example top dielectric layer DL116 of the stack of FIG. 5B;

FIG. 7 depicts a threshold voltage distribution of a page of memory cells programmed to one bit per memory cell (SLC);

FIG. 8 depicts a threshold voltage distribution of a page of memory cells programmed to three bits per memory cell (TLC);

FIG. 9 depicts a threshold voltage distribution of a page of memory cells programmed to four bits per memory cell (QLC);

FIG. 14A is a threshold voltage distribution of a plurality of memory cells programmed to TLC (three bits per memory cell) at a high temperature and using a normal program voltage step size;

FIG. 14B is a threshold voltage distribution of a plurality of memory cells programmed to TLC at a high temperature and using a reduced program voltage step size;

FIG. 15A is a threshold voltage distribution of a plurality of memory cells programmed to TLC at a low temperature and using a reduced program voltage step size;

FIG. 15B is a threshold voltage distribution of the plurality of memory cells of FIG. 15A but during a read at a high temperature;

DESCRIPTION OF THE ENABLING EMBODIMENTS

As discussed in further detail below, the programming techniques of the present disclosure allow a memory device to operate at high performance at an increased range of temperatures as compared to other known programming techniques. In other words, the memory device can continue operating at a high performance to very high temperatures without throttling. This is accomplished by reducing the programming voltage step size dVPGM when the memory device senses that its operating temperature is above a threshold voltage, thereby allowing memory cells to be programmed with a higher threshold voltage margin (Vt margin). Throttling of all aspect of the memory device is not required unless the operating temperature reaches a very high/extreme temperature that is higher than the temperature where other known memory devices begin throttling performance. In other words, these programming techniques increase the temperature range where the memory device is able to operate at high performance without throttling.

Figures 10A, 10B:
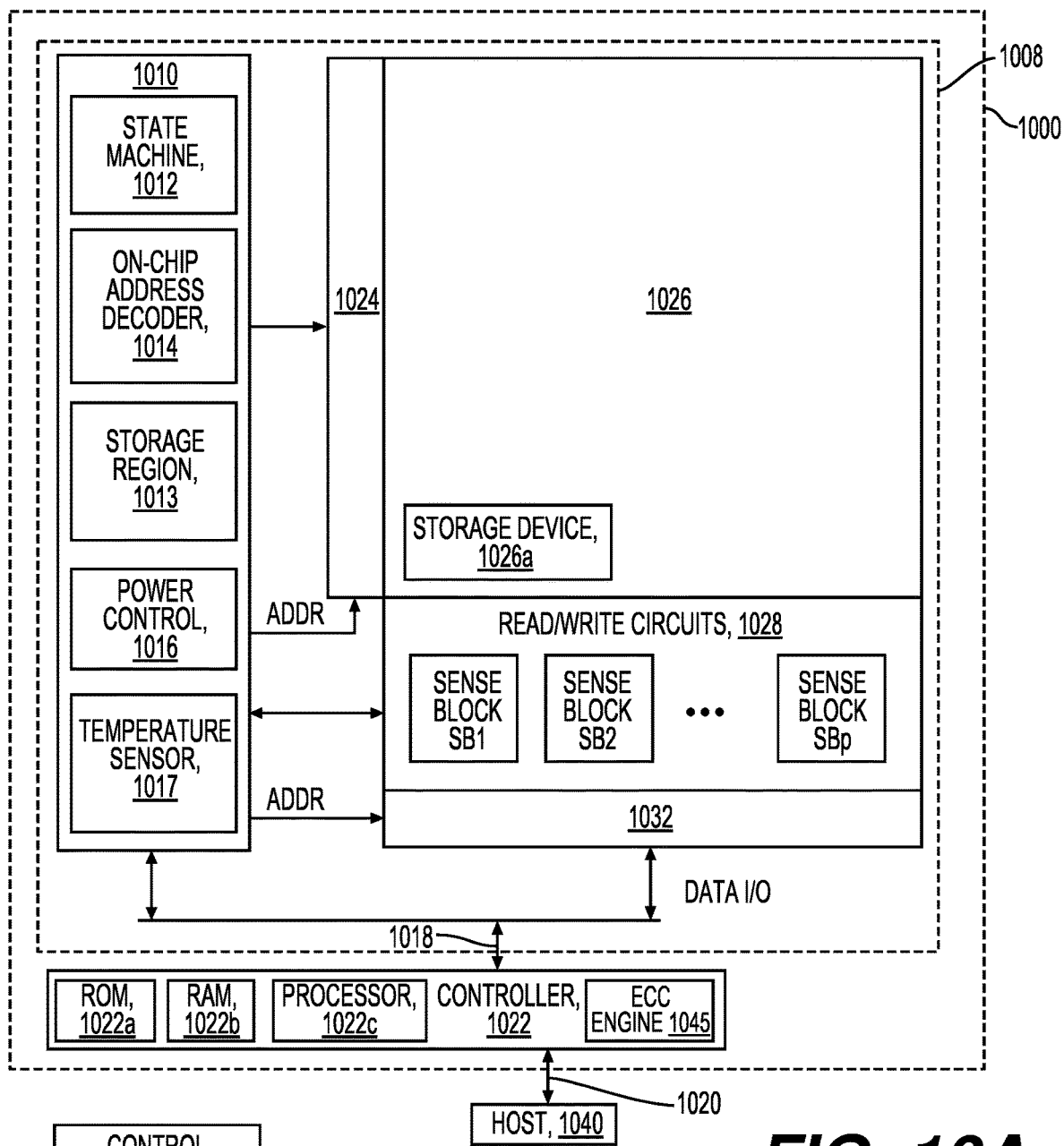
FIG. 10A is a block diagram of an example memory device.
FIG. 10B is a block diagram of an example control circuit.

FIG. 10A is a block diagram of an example memory device 1000 that is configured to operate according to the programming techniques of the present disclosure. The memory die 1008 includes a memory structure 1026 of memory cells, such as an array of memory cells arranged in memory blocks and word lines, control circuitry 1010, and read/write circuits 1028. The memory structure 1026 is addressable by word lines via a row decoder 1024 and by bit lines via a column decoder 1032. The read/write circuits 1028 include multiple sense blocks SB1, SB2, . . . SBp (sensing circuitry) and allow a page of memory cells to be read or programmed in parallel. Typically, a controller 1022 is included in the same memory device 1000 (e.g., a removable storage card) as the one or more memory die 1008. Commands and data are transferred between the host 1040 and controller 1022 via a data bus 1020, and between the controller and the one or more memory die 1008 via lines 1018.

The memory structure 1026 can be two-dimensional or three-dimensional. The memory structure 1026 may comprise one or more array of memory cells including a three-dimensional array. The memory structure 1026 may comprise a monolithic three-dimensional memory structure in which multiple memory levels are formed above (and not in) a single substrate, such as a wafer, with no intervening substrates. The memory structure 1026 may comprise any type of non-volatile memory that is monolithically formed in one or more physical levels of arrays of memory cells having an active area disposed above a silicon substrate. The memory structure 1026 may be in a non-volatile memory device having circuitry associated with the operation of the memory cells, whether the associated circuitry is above or within the substrate.

Figure 10C:
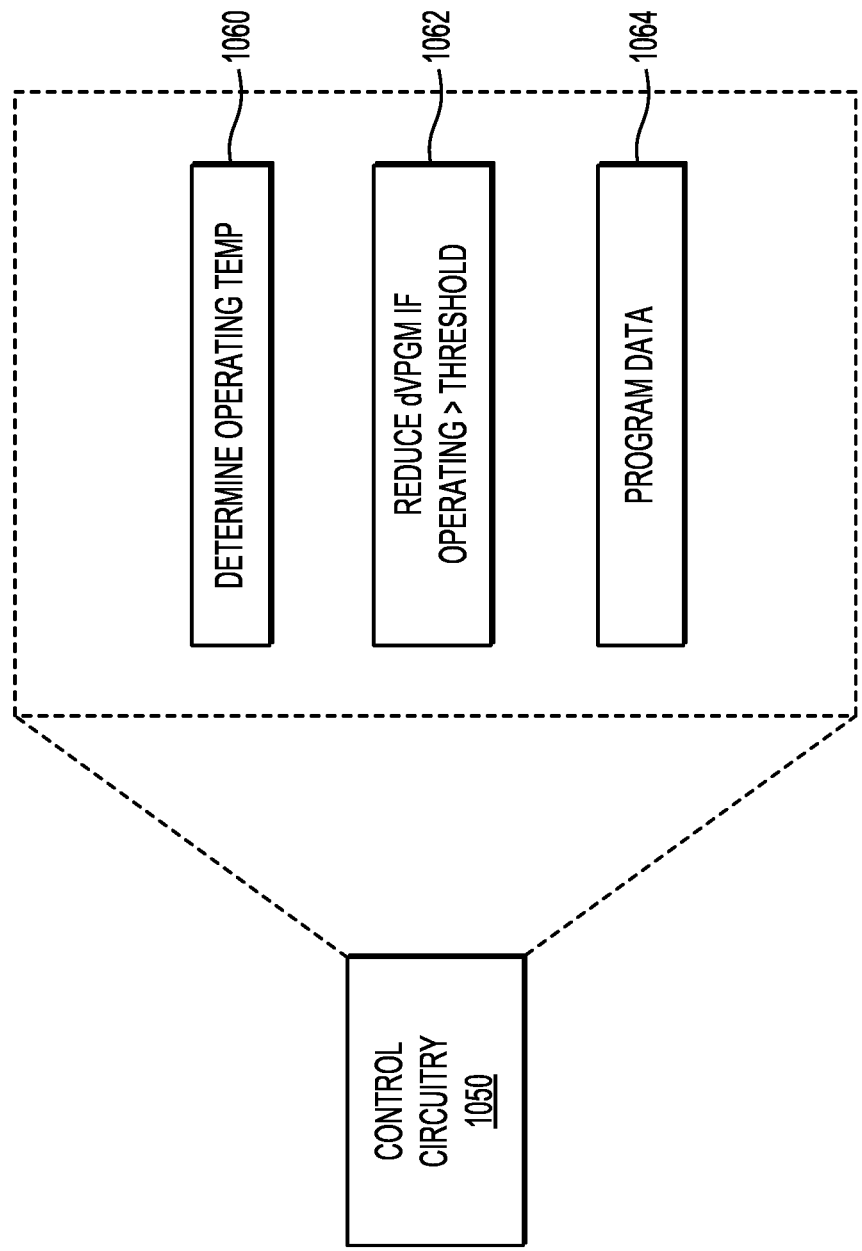
FIG. 10C is another block diagram of an example control circuit.

The control circuitry 1010 cooperates with the read/write circuits 1028 to perform memory operations on the memory structure 1026, and includes a state machine 1012, an on-chip address decoder 1014, a storage region 1013, a power control module 1016, and a temperature sensor 1017. The state machine 1012 provides chip-level control of memory operations. As discussed in further detail below and illustrated in FIG. 10C, the control circuitry 1010 is configured to operate the memory device 1000 according to program techniques that allow the memory device to operate at high performance and high reliability over an increased range of operating temperatures, including at higher temperatures where other known memory devices are throttled to protect data reliability. At step 1060, the control circuitry determines the operating temperature of the memory device. At step 1062, the control circuitry reduces a voltage step size dVPGM (discussed in further detail below) from a baseline voltage step size dVPGMU by a bias dVPGM_HT in response to the operating temperature being greater than a threshold temperature. At step 1064, the control circuitry programs the data to one or more word lines in a selected memory block without throttling the chip's performance.

Turning back to FIG. 10A, a storage region 1013 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 1014 provides an address interface that is used by the host or a memory controller to determine the hardware address used by the decoders 1024 and 1032. The power control module 1016 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 1026, can be thought of as at least one control circuit which is configured to perform the actions described herein. For example, a control circuit may include any one of, or a combination of, control circuitry 1010, state machine 1012, decoders 1014/1032, power control module 1016, sense blocks SBb, SB2, . . . , SBp, read/write circuits 1028, controller 1022, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed. For example, FIG. 10B is a block diagram of an example control circuit 1050 which comprises a programming circuit 1051, a counting circuit 1052, and a determination circuit 1053.

The off-chip controller 1022 may comprise a processor 1022c, storage devices (memory) such as ROM 1022a and RAM 1022b and an error-correction code (ECC) engine 1045. The ECC engine can correct a number of read errors which are caused when the upper tail of a Vt distribution becomes too high. However, uncorrectable errors may exist in some cases. The techniques provided herein reduce the likelihood of uncorrectable errors.

The storage device(s) 1022a, 1022b comprise, code such as a set of instructions, and the processor 1022c is operable to execute the set of instructions to provide the functionality described herein. Alternately or additionally, the processor 1022c can access code from a storage device 1026a of the memory structure 1026, such as a reserved area of memory cells in one or more word lines. For example, code can be used by the controller 1022 to access the memory structure 1026 such as for programming, read and erase operations. The code can include boot code and control code (e.g., set of instructions). The boot code is software that initializes the controller 1022 during a booting or startup process and enables the controller 1022 to access the memory structure 1026. The code can be used by the controller 1022 to control one or more memory structures 1026. Upon being powered up, the processor 1022c fetches the boot code from the ROM 1022a or storage device 1026a for execution, and the boot code initializes the system components and loads the control code into the RAM 1022b. Once the control code is loaded into the RAM 1022b, it is executed by the processor 1022c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 11:
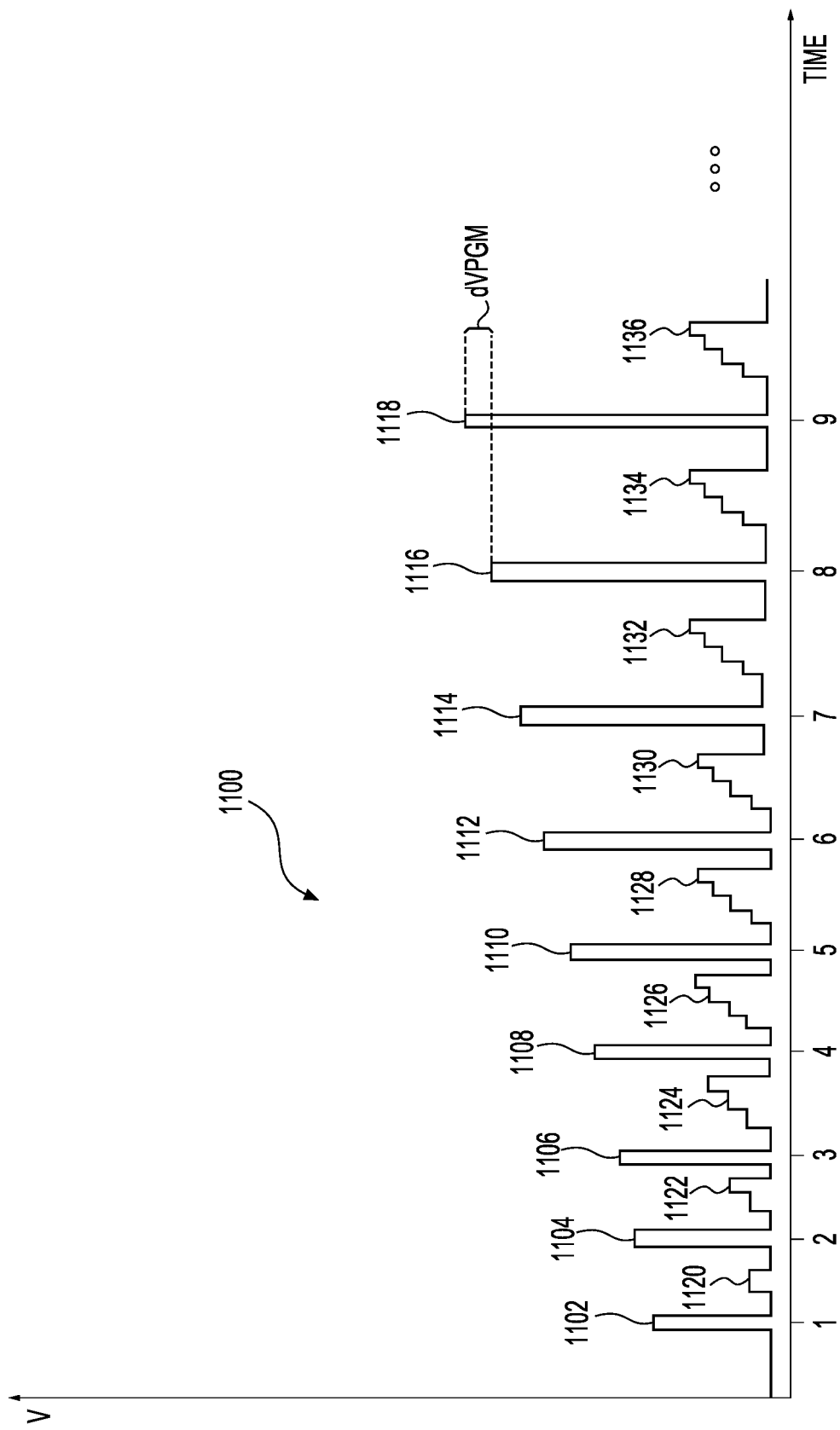
FIG. 11 is a voltage waveform of the voltage applied to a control gate of a selected word line during a programming operation.

Programming the memory cells occurs on a word line-by-word line basis from one side of the memory block towards an opposite side of the memory block. Typically, programming the memory cells of a selected word line to retain multiple bits per memory cell (for example, MLC, TLC, or QLC) starts with the memory cells being in the erased data state and includes a plurality of program loops, and each program loop includes both a programming pulse and a verify operation. FIG. 11 depicts a waveform 1100 of the voltages applied to a selected word line during an example programming operation for programming the memory cells of the selected word line to a greater number of bits per memory cell (e.g., TLC or QLC). As depicted, each program loop includes a programming pulse and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the program pulse voltage VPGM steps up, or increases, in each successive program loop. More specifically, the pulse train includes program pulse voltages VPGM that increase stepwise in amplitude with each successive program loop by a fixed program voltage step size (dVPGM). A new pulse train starts with the program pulse being at a starting voltage VPGMU and ends with it being at a final program pulse voltage, which does not exceed a maximum allowed voltage. The example pulse train 1100 includes a series of program pulses 1101-1115 that are applied to a control gate of the selected word line to program the memory cells of that word line and that increase in amplitude by the program voltage step size dVPGM between pulses.

One or more verify voltage pulses 1116-1129 are provided after each program pulse, based on the target data states which are being verified in the respective program loops. The verify voltages may be the voltages Vv1-Vv7 shown in FIG. 8 or Vv1-Vv15 shown in FIG. 9 and/or may be verify low voltages associated with any of the data states, as discussed in further detail below. Concurrent with the application of the verify voltages, a sensing operation can determine whether a particular memory cell in the selected word line has a threshold voltage Vt above the verify voltage Vv associated with its intended data state by sensing a current through a string that contains the memory cell. If the current is relatively high during sensing, this indicates that the memory cell is in a conductive state, such that its threshold voltage Vt is less than the verify voltage Vv. If the current is relatively low during sensing, this indicates that the memory cell is in a non-conductive state, such that its threshold voltage Vt is above the verify voltage Vv. If the memory cell passes verify, programming of that memory cell is completed and further programming of that memory cell is inhibited (or locked out) for all remaining program loops by applying an inhibit voltage to a bit line coupled with the memory cell concurrent with the program pulse and by skipping verify for those memory cells. Programming proceeds until all memory cells of the selected word line pass verify for their intended data states, in which case, programming passes, or until a predetermined maximum number of program loops is exceeded, in which case, programming fails. In some embodiments, the memory cells of a word line can be divided into a series of string groups that can be programmed independently of one another, and programming can commence from one string group to another string group across the word line before proceeding to the next word sequential line in the memory block.

One aspect of the present disclosure is related to a programming technique which allows for improved performance of the memory device at high temperatures without compromising the Vt margin of the data. As discussed in further detail below, these results are achieved by configuring the memory device to reduce the program voltage step size dVPGM that the program pulse voltage VPGM is increased by between program loops when the memory device detects or otherwise senses that its operating temperature is above a predetermined threshold temperature. All other operating parameters of the memory device remain the same as when the memory device is operating at normal operating temperatures, i.e., the memory device is not throttled. While it may take one or more additional program loops to complete programming with the reduced program voltage step size dVPGM, the increased time to perform a small number of additional program loops is more than offset by the time that is saved by not throttling the chip. Thus, at temperatures above the threshold temperature, the memory device is able to operate at higher performance than other known memory devices that are throttled when the temperature exceeds the threshold temperature.

Figure 12:
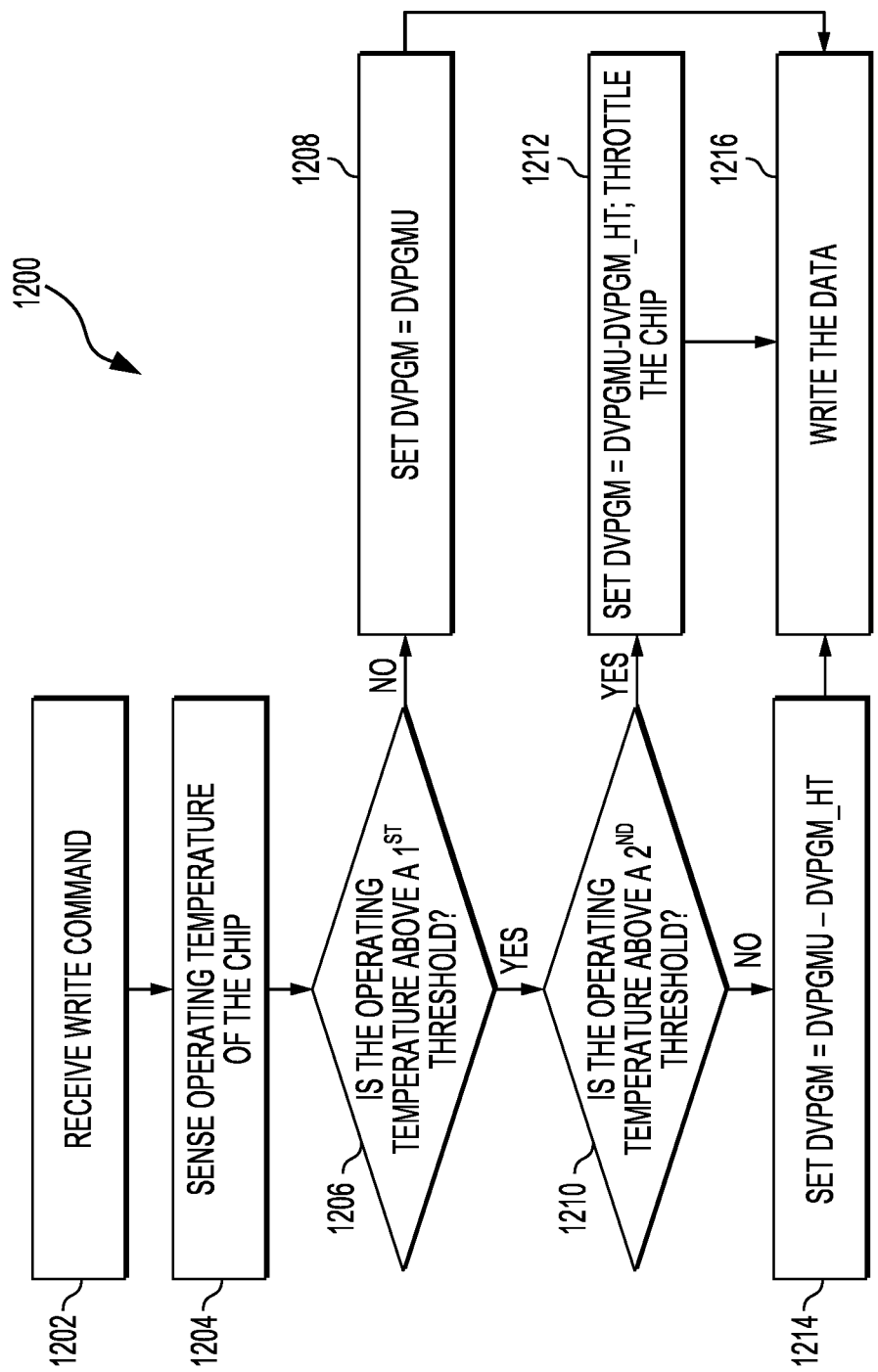
FIG. 12 is a flow chart depicting the steps of programming a memory device according to a first exemplary embodiment of the present disclosure.

Turning now to FIG. 12, a flow chart 1200 illustrates the steps of programming a memory device according to an exemplary embodiment of the present disclosure. The following steps can be implemented by the control circuitry of the memory device. At step 1202, the memory device receives a write command to program user data to the word lines of a memory block or sub-block. At step 1204, the memory device senses the operating temperature of the chip and compares the operating temperature of the chip to two thresholds: a first high temperature threshold and a second high temperature threshold. In an example embodiment, the first high temperature threshold is fifty degrees Celsius (50° C.) and the second high temperature threshold is seventy degrees Celsius (70° C.). In some other embodiments, the first and second high temperature thresholds can be set at other levels with the second high temperature threshold being greater than the first high temperature threshold.

At decision step 1206, it is determined if the operating temperature of the chip is above the first high temperature threshold. If the answer at step 1208 is "no," then at step 1208, the program voltage step size dVPGM is set to a baseline level dVPGMU. In other words, if the operating temperature of the chip is either cool or normal (below, for example, 50° C.), then the program voltage step size dVPGM is not adjusted from the baseline dVPGMU. Thus, programming each word line of the memory block will proceed as normal with the magnitude of the program pulse voltage VPGM increasing by the baseline dVPGMU between program loops.

If the answer at decision step 1206 is "yes," then the process proceeds to decision step 1210. At decision step 1210, it is determined the operating chip is greater than a second high temperature threshold. If the answer at decision step 1210 is "yes," then at step 1212, the program voltage step size dVPGM is set to dVPGMU-dVPGM_HT and the performance of the chip is throttled to cool the chip. In other words, if the operating temperature is extremely hot (for example, above 70° C.), then all or substantially all performance aspects (including programming, sensing, etc.) of the chip are slowed to reduce heat generation and lower the operating temperature of the chip and improve the Vt margin of the memory cells being programmed.

If the answer at decision step 1210 is "no," then at step 1214, the program voltage step size dVPGM is reduced from the baseline voltage dVPGMU by a high temperature bias dVPGM_HT, i.e., dVPGM=dVPGMU-dVPGM_HT. This reduces the program pulse voltage VPGM in all program loops after the first program loop for each word line being programmed. By reducing dVPGM when programming at hot but not extremely hot temperatures (for example, between 50° C. and 70° C.), VPGM rises by a reduced magnitude between program loops, thereby reducing the tunneling of electrons into the charge trapping layers of the memory cells during the program pulses following the first program loop. While this may result in one or more additional program loops being necessary to complete programming of the memory cells of a word line, the performance that is lost due to the at least one additional program loop is substantially less than the amount of performance that is lost when the chip is throttled. In some example embodiments, the bias dVPGM_HT is in the range of 0.05 V to 0.8 V.

FIG. 14A illustrates the Vt distribution of a plurality of memory cells that are programmed at high temperature (for example, between 50° C. and 70° C.) using the baseline program voltage step size dVPGMU, and FIG. 14B illustrates the Vt distribution of a plurality of memory cells that are programmed at the same high temperature but using the program voltage step size dVPGM that has been reduced from the baseline program voltage step size dVPGMU by the bias dVPGM_HT. As illustrated, the Vt margin is improved in the FIG. 14B distribution as compared to the FIG. 14A distribution, and therefore, reducing the program voltage step size dVPGM when programming at high temperatures improves the Vt margin of the resulting threshold voltage distribution and improves the reliability of the data.

Figure 16:
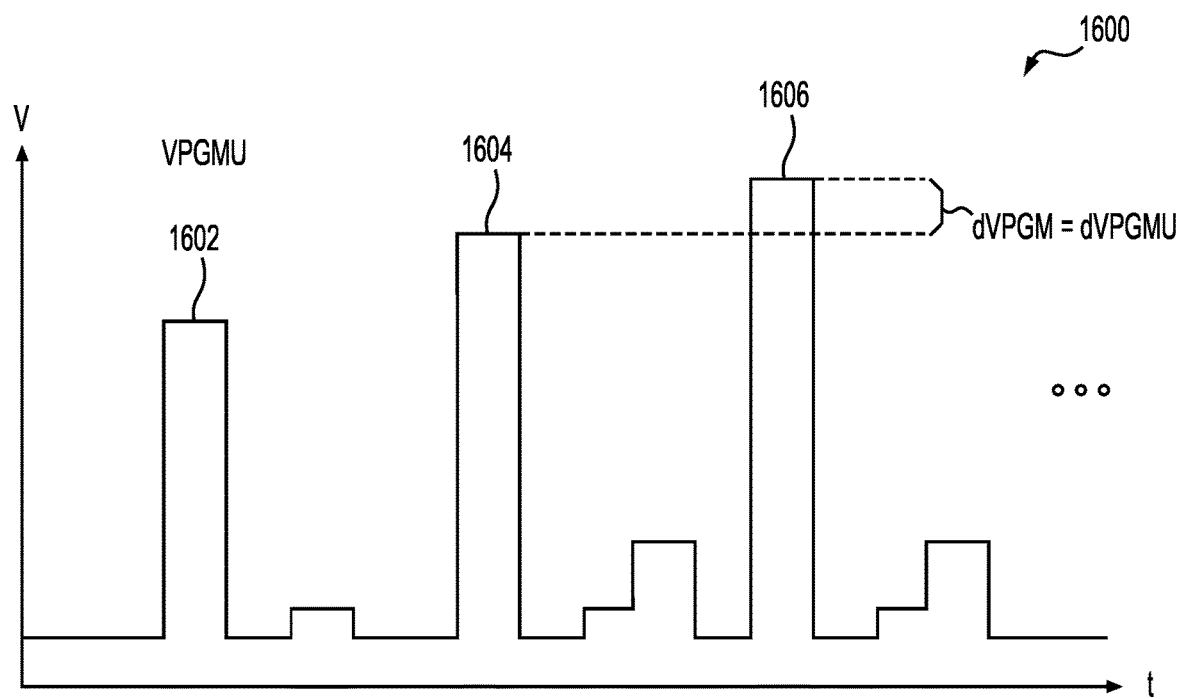
FIG. 16 is a voltage waveform of the voltages applied to a control gate of a selected word line during three program loops and using a baseline program voltage step size dVPGMU.
Figure 17:
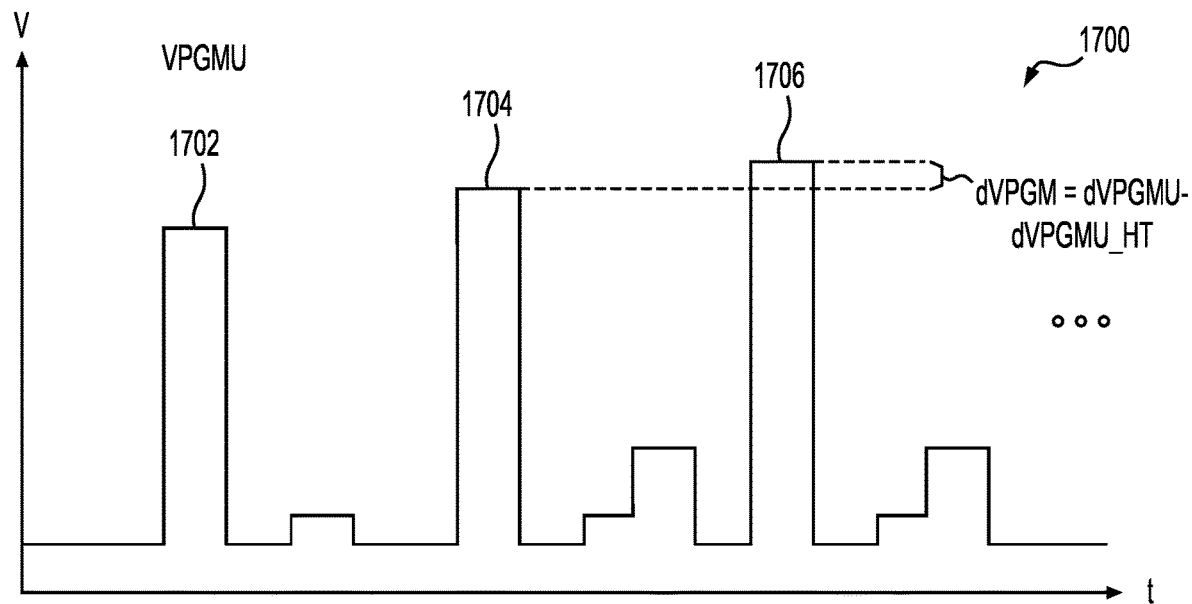
FIG. 17 is a voltage waveform of the voltages applied to a control gate of a selected word line during three program loops and using a program voltage step size dVPGM that has been reduced from the baseline program voltage step size dVPGMU by a bias dVPGM_HT.

FIG. 16 illustrates a portion of a waveform 1600 of the voltage applied to the control gate of a selected word line during program where the voltage step size dVPGM is the baseline dVPGMU. As illustrated, in this waveform, the magnitude of the program pulse voltage 1602-1606 increases by dVPGMU between program loops. FIG. 17 illustrates a portion of a voltage waveform 1700 where the voltage step size dVPGM is reduced from the baseline dVPGMU by the bias dVPGM_HT. As illustrated, the magnitude of the program pulse voltages 1702-1706 increases more slowly than was the case in the waveform 1600 of FIG. 16 due to the reduced voltage step size dVPGM.

Following either step 1208, 1212, or 1214, at step 1216, the control circuitry writes the data to the word lines of the memory block. When programming each word line, the program pulse voltage VPGM for the first program loop of each word line is a starting voltage VPGMU. In between program loops, the program pulse voltage VPGM is increased by the program voltage step size dVPGM. The program operation proceeds from word line to word line across the memory block until either all of the data is written to the memory block or until the memory block is closed.

Figure 13:
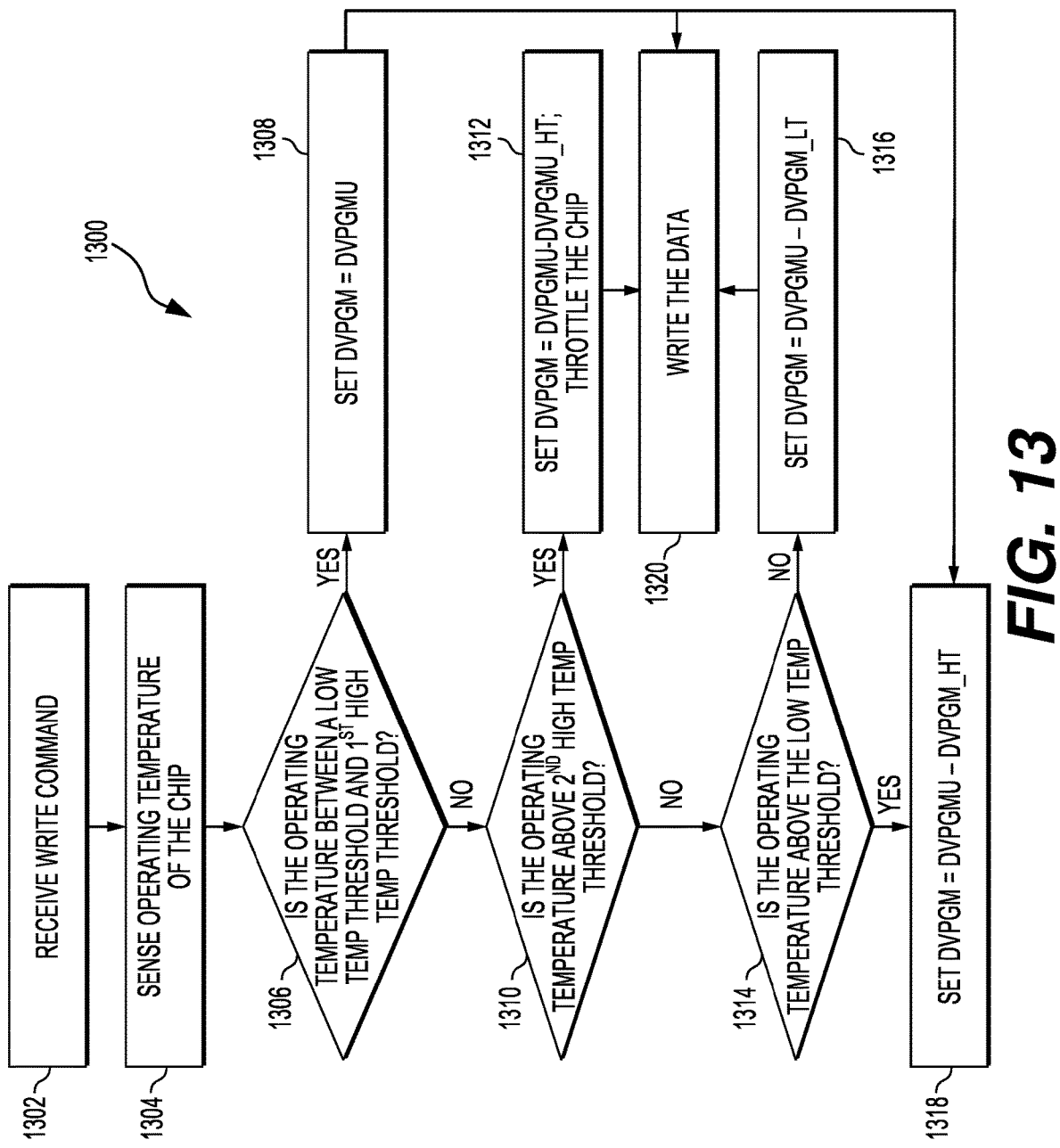
FIG. 13 is a flow chart depicting the steps of programming a memory device according to a second exemplary embodiment of the present disclosure.

Turning now to FIG. 13, a flow chart 1300 illustrates the steps of programming a memory device according to a second exemplary embodiment of the present disclosure. The following steps can be implemented by the control circuitry of the memory device. At step 1302, the memory device receives a write command to program user data to one or more word lines in a selected memory block. At step 1304, the memory device senses the operating temperature of the chip and compares the operating temperature of the chip to three thresholds: a first high temperature threshold, a second high temperature threshold, and a low temperature threshold. In an example embodiment, the first high temperature threshold is fifty degrees Celsius (50° C.), the second high temperature threshold is seventy degrees Celsius (70° C.), and the low temperature threshold is zero degrees Celsius (0° C.). In some other embodiments, the high and low temperature thresholds can be set at other levels with the second high temperature threshold being greater than the first high temperature threshold and with both of the high temperature thresholds being greater than the low temperature threshold.

At decision step 1306, the control circuitry determines if the operating temperature of the chip is between the low temperature threshold and the first high temperature threshold. If the answer at step 1306 is "yes," then at step 1308, the program voltage step size dVPGM is set to a baseline level dVPGMU. In other words, if the operating temperature of the chip is normal (for example, between 0° C. and 50° C.), then the program voltage step size dVPGM is not adjusted from the baseline dVPGMU. Thus, programming each word line of the memory block will proceed as normal with the magnitude of the program pulse voltage VPGM increasing by the baseline dVPGMU between program loops.

If the answer at decision step 1306 is "no," then at decision step 1310, the control circuitry determines if the operating temperature of the chip is above the second high temperature threshold. If the answer at decision step 1310 is "yes," then at step 1312, the voltage step size dVPGM is set to the dVPGMU-dVPGM_HT and the performance of the chip is also throttled to cool the chip. In other words, if the operating temperature of the chip is extremely hot (for example, above 70° C.), then all performance aspects (including programming, sensing, etc.) of the chip are slowed to reduce heat generation and lower the operating temperature of the chip and improve the Vt margin of the memory cells being programmed.

If the answer at decision step 1310 is "no," then at decision step 1314, it is determined if the operating temperature of the chip is above the low temperature threshold. If the answer at decision step 1314 is no, then at step 1316, the voltage step size dVPGM is reduced from the baseline dVPGMU by a low temperature bias voltage dVPGM_LT, i.e., dVPGM=dVPGMU-dVPGM_LT. By decreasing the voltage step size dVPGM when programming at low temperature (for example, below 0° C.), the Vt margin of the data that is programmed to the memory cells in the selected memory block is improved, thereby making the memory device more resilient against cross-temperature performance, specifically when data is programmed at low temperatures and read at high temperatures.

FIG. 15A illustrates a threshold voltage Vt distribution of a plurality of memory cells that are programmed at a low temperature (for example, below 0° C.), and FIG. 15B illustrates the threshold voltage distribution of the same memory cells when they are read at a high temperature (for example, above 50° C.). As illustrated, the drastic change in temperature from programming to read automatically reduces the Vt margin of the distribution and can compromise the reliability of the data. By improving the Vt margin at the time of programming at the cold temperatures through the reduction in the voltage step size dVPGM by the bias dVPGM_LT (step 1316), the reliability of the data when it is later read at a high temperature is improved.

If the answer at decision step 1314 is "yes," then at step 1318, the program voltage step size dVPGM is reduced to reduce from the baseline voltage dVPGMU by a high temperature bias dVPGM_HT to reduce the magnitude of the program pulse voltage VPGM on all program loops after the first program loop when programming each word line of the memory block, i.e., dVPGM=dVPGMU-dVPGM_HT. By reducing dVPGMU by the high temperature bias when programming at hot but not extremely hot temperatures (for example, between 50° C. and 70° C.), the programming voltage VPGM rises by a reduced magnitude between program loops, thereby reducing the tunneling of electrons into the charge trapping layers of the memory cells during the program pulses following the first program loop. While it may require one or more additional program loops to complete programming of the memory cells of a word line due to the reduced program voltage step size dVPGM, the performance that is lost due to the at least one additional program loop is substantially less than the amount of performance that is lost when the chip is throttled. In an example embodiment, the bias dVPGM_HT is approximately one tenth of a volt (0.1 V).

Following either step 1308, 1312, 1316, or 1318, at step 1320, the control circuitry writes the data to the word lines of the memory block. When programming each word line, the program pulse voltage VPGM for the first program loop of each word line is a starting voltage VPGMU. In between program loops, the program pulse voltage VPGM is increased by the program voltage step size dVPGM. The program operation proceeds until either all of the user data is written to the memory block, until programming fails, or until the memory block is closed.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
   preparing a memory block that includes a plurality of memory cells that are arranged in a plurality of word lines;
   selecting a word line to program;
   setting a programming pulse voltage to a starting programming pulse value;
   determining an operating temperature of the memory device and comparing the operating temperature to a first threshold temperature;
   in response to the operating temperature of the memory device being less than the first threshold temperature, setting a program voltage step size to a baseline step size;
   in response to the operating temperature of the memory device being greater than the first threshold temperature, setting the program voltage step size to a high temperature step size that is less than the baseline step size; and
   programming the memory cells of the selected word line in a plurality of program loops, each program loop including a programming pulse, and wherein a magnitude of the programming pulse increasing between program loops by the program voltage step size.

2. The method as set forth in claim 1, further including the step of comparing the operating temperature to a second threshold temperature that is greater than the first threshold temperature, and
   in response to the operating temperature being greater than the second threshold temperature, throttling the memory device.

3. The method as set forth in claim 1, wherein the first threshold temperature is a first high temperature threshold and the second threshold temperature is a second high temperature threshold, and further including the steps of:
   comparing the operating temperature to a low temperature threshold that is less than the first high temperature threshold, and
   in response to the operating temperature being below the low temperature threshold, setting the program voltage step size to a low temperature step size that is less than the baseline step size.

4. The method as set forth in claim 3, wherein the low temperature step size is in the range of 0.05 V to 0.8 V less than the baseline step size.

5. The method as set forth in claim 1, wherein the high temperature step size is in the range of 0.05 V to 0.8 V less than the baseline step size.

6. The method as set forth in claim 1, further including the steps of:
   selecting a next word line to program;
   setting the programming pulse voltage to the starting programming pulse voltage; and
   programming the memory cells of the selected word line in a plurality of program loops, each program loop including a programming pulse, and wherein a magnitude of the programming pulse increasing between program loops by the program voltage step size.

7. The method as set forth in claim 1, wherein the step of programming the memory cells of the selected word line includes programming the memory cells of the selected word line to at least three bits of data per memory cell.

8. A memory device, comprising:
   a memory block that includes a plurality of memory cells that are arranged in a plurality of word lines; and
   control circuitry that is configured to program the plurality of memory cells of the plurality of word lines, the control circuitry being configured to;
   select a word line to program,
   set a programming pulse voltage to a starting programming pulse value,
   determine an operating temperature of the memory device and compare the operating temperature to a first threshold temperature,
   in response to the operating temperature of the memory device being less than the first threshold temperature, set a program voltage step size to a baseline step size,
   in response to the operating temperature of the memory device being greater than the first threshold temperature, set the program voltage step size to a high temperature step size that is less than the baseline step size, and
   program the memory cells of the selected word line in a plurality of program loops, each program loop including a programming pulse, and wherein the control circuitry increases a magnitude of the programming pulse between program loops by the program voltage step size.

9. The memory device as set forth in claim 8, wherein the control circuitry is further configured to compare the operating temperature to a second threshold temperature that is greater than the first threshold temperature, and in response to the operating temperature being greater than the second threshold temperature, throttle the memory device.

10. The memory device as set forth in claim 8, wherein the first threshold temperature is a first high temperature threshold and the second threshold temperature is a second high temperature threshold, and the control circuitry is further configured to:

compare the operating temperature to a low temperature threshold that is less than the first high temperature threshold, and in response to the operating temperature being below the low temperature threshold, set the program voltage step size to a low temperature step size that is less than the baseline step size.

11. The memory device as set forth in claim 10, wherein the low temperature step size is in the range of 0.05 V to 0.8 V less than the baseline step size.

12. The memory device as set forth in claim 8, wherein the high temperature step size is in the range of 0.05 V to 0.8 V less than the baseline step size.

13. The memory device as set forth in claim 8, wherein the control circuitry is further configured to:

select a next word line to program;

set the programming pulse voltage to the starting programming pulse voltage; and program the memory cells of the selected word line in a plurality of program loops, each program loop including a programming pulse, and wherein a magnitude of the programming pulse increasing between program loops by the program voltage step size.

14. The memory device as set forth in claim 8, wherein the control circuitry is further configured to program the memory cells of the selected word line to at least three bits of data per memory cell.

15. An apparatus, comprising:

a memory block that includes a plurality of memory cells that are arranged in a plurality of word lines; and a programming means for programming the plurality of memory cells of the plurality of word lines, the programming means being configured to;

select a word line to program, determine an operating temperature of the memory device and compare the operating temperature to a first threshold temperature, in response to the operating temperature of the memory device being less than the first threshold temperature, set a program voltage step size to a baseline step size, in response to the operating temperature of the memory device being greater than the first threshold temperature, set the program voltage step size to a high temperature step size that equal to the baseline step size minus a high temperature bias, and program the memory cells of the selected word line in a plurality of program loops, each program loop including a programming pulse, and wherein the control circuitry increases a magnitude of the programming pulse between program loops by the program voltage step size.

16. The apparatus as set forth in claim 15, wherein the programming means is further configured to compare the operating temperature to a second threshold temperature that is greater than the first threshold temperature, and in response to the operating temperature being greater than the second threshold temperature, throttle the memory device.

17. The apparatus as set forth in claim 15, wherein the first threshold temperature is a first high temperature threshold and the second threshold temperature is a second high temperature threshold, and the programming means is further configured to:

compare the operating temperature to a low temperature threshold that is less than the first high temperature threshold, and in response to the operating temperature being below the low temperature threshold, set the program voltage step size to a low temperature step size that is less than the baseline step size.

18. The apparatus as set forth in claim 17, wherein the low temperature step size is in the range of 0.05 V to 0.8 V less than the baseline step size.

19. The apparatus as set forth in claim 15, wherein the high temperature step size is in the range of 0.05 V to 0.8 V less than the baseline step size.

20. The apparatus as set forth in claim 15, wherein the programming means is further configured to:

select a next word line to program;

set the programming pulse voltage to the starting programming pulse voltage; and program the memory cells of the selected word line in a plurality of program loops, each program loop including a programming pulse, and wherein a magnitude of the programming pulse increasing between program loops by the program voltage step size.

\* \* \* \* \*